(12) United States Patent
Kotake et al.

(10) Patent No.: US 10,119,047 B2
(45) Date of Patent: Nov. 6, 2018

(54) THERMOSETTING RESIN COMPOSITION, AND PREPREG, INSULATING FILM WITH SUPPORT, LAMINATE PLATE, AND PRINTED WIRING BOARD, EACH OBTAINED USING SAME

(71) Applicant: Hitachi Chemical Company, Ltd., Tokyo (JP)

(72) Inventors: Tomohiko Kotake, Ibaraki (JP); Shinji Tsuchikawa, Ibaraki (JP); Hiroyuki Izumi, Ibaraki (JP); Masato Miyatake, Ibaraki (JP); Shin Takanezawa, Ibaraki (JP); Hikari Murai, Ibaraki (JP); Tetsurou Irino, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 547 days.

(21) Appl. No.: 14/675,023

(22) Filed: Mar. 31, 2015

(65) Prior Publication Data

US 2015/0203715 A1   Jul. 23, 2015

Related U.S. Application Data

(63) Continuation of application No. 13/258,763, filed as application No. PCT/JP2010/055392 on Mar. 26, 2010, now abandoned.

(30) Foreign Application Priority Data

Mar. 27, 2009  (JP) ................................. 2009-080424
Jan. 22, 2010  (JP) ................................. 2010-012543
Feb. 2, 2010  (JP) ................................. 2010-021457

(51) Int. Cl.
| C08L 63/00 | (2006.01) |
| C09D 179/08 | (2006.01) |
| B32B 27/38 | (2006.01) |
| C08J 5/24 | (2006.01) |
| H05K 1/03 | (2006.01) |
| B32B 15/14 | (2006.01) |
| C08G 59/50 | (2006.01) |
| C08L 79/08 | (2006.01) |
| C09D 163/00 | (2006.01) |
| B32B 5/02 | (2006.01) |
| B32B 5/24 | (2006.01) |
| B32B 27/06 | (2006.01) |
| B32B 27/18 | (2006.01) |
| B32B 27/20 | (2006.01) |
| B32B 27/28 | (2006.01) |
| B32B 27/32 | (2006.01) |
| B32B 27/36 | (2006.01) |
| B32B 27/42 | (2006.01) |

(52) U.S. Cl.
CPC ............ *C09D 179/085* (2013.01); *B32B 5/02* (2013.01); *B32B 5/24* (2013.01); *B32B 15/14* (2013.01); *B32B 27/06* (2013.01); *B32B 27/18* (2013.01); *B32B 27/20* (2013.01); *B32B 27/281* (2013.01); *B32B 27/283* (2013.01); *B32B 27/325* (2013.01); *B32B 27/36* (2013.01); *B32B 27/38* (2013.01); *B32B 27/42* (2013.01); *C08G 59/5073* (2013.01); *C08J 5/24* (2013.01); *C08L 63/00* (2013.01); *C08L 79/085* (2013.01); *C09D 163/00* (2013.01); *H05K 1/0353* (2013.01); *B32B 2260/021* (2013.01); *B32B 2260/023* (2013.01); *B32B 2260/046* (2013.01); *B32B 2264/102* (2013.01); *B32B 2307/306* (2013.01); *B32B 2307/50* (2013.01); *B32B 2307/536* (2013.01); *B32B 2307/714* (2013.01); *B32B 2307/7265* (2013.01); *B32B 2457/08* (2013.01); *Y10T 428/24802* (2015.01); *Y10T 428/249921* (2015.04); *Y10T 428/31721* (2015.04); *Y10T 442/2721* (2015.04)

(58) Field of Classification Search
USPC .......................... 428/195.1, 473.5; 523/400
See application file for complete search history.

(56) References Cited

U.S. PATENT DOCUMENTS

| 4,797,455 A | 1/1989 | Lin et al. |
| 6,124,023 A | 9/2000 | Furuta et al. |

(Continued)

FOREIGN PATENT DOCUMENTS

| CN | 1321179 A | 11/2001 |
| CN | 1654539 A | 8/2005 |

(Continued)

OTHER PUBLICATIONS

Chinese Official Action, dated Nov. 13, 2012, for CN Application No. 201080014139.1.
Japanese Official Action, dated Mar. 4, 2014, of JP Application No. JP 2012-239553.
Japanese Official Action, dated Mar. 11, 2014, of JP Application No. 2010-021457.
Japanese Official Action, dated Mar. 18, 2014, of JP Application No. 2010-066353.

(Continued)

*Primary Examiner* — Lynda Salvatore
(74) *Attorney, Agent, or Firm* — Fitch, Even, Tabin & Flannery, L.L.P.

(57) ABSTRACT

A thermosetting resin composition containing: (A) a resin composition having an unsaturated maleimide group, produced by reacting (a) a maleimide compound having at least two N-substituted maleimide groups per one molecule and (b) an amine compound having at least two primary amino groups per one molecule, in an organic solvent; (B) a thermosetting resin; and (C) a modified imidazole compound, such as an isocyanate-masked imidazole and an epoxy-masked imidazole, and a prepreg, an insulating film with a support, a laminate plate and a printed wiring board, each containing the same.

22 Claims, No Drawings

(56) References Cited

U.S. PATENT DOCUMENTS

| | | | |
|---|---|---|---|
| 6,492,437 B1* | 12/2002 | Musa | C08G 59/184 523/456 |
| 2002/0155298 A1 | 10/2002 | Hiral et al. | |
| 2005/0181215 A1 | 8/2005 | Suzuki et al. | |
| 2007/0018944 A1 | 1/2007 | Johnson et al. | |
| 2007/0221890 A1 | 9/2007 | Gan | |
| 2007/0237092 A1 | 10/2007 | Balachandran et al. | |
| 2007/0264438 A1 | 11/2007 | Kawai | |
| 2008/0200636 A1* | 8/2008 | Nakanishi | C08L 63/00 528/105 |
| 2009/0215943 A1 | 8/2009 | Hirose et al. | |
| 2010/0044081 A1 | 2/2010 | Morimoto et al. | |
| 2010/0143728 A1 | 6/2010 | Tsuchikawa et al. | |
| 2012/0316263 A1 | 12/2012 | Tsuchikawa et al. | |

FOREIGN PATENT DOCUMENTS

| | | |
|---|---|---|
| CN | 101277992 A | 10/2008 |
| JP | 63-077928 | 4/1988 |
| JP | 03-177419 | 8/1991 |
| JP | 03-177420 | 8/1991 |
| JP | 04-351629 | 12/1992 |
| JP | 04-359052 | 12/1992 |
| JP | 07-278258 | 10/1995 |
| JP | 08-134351 | 5/1996 |
| JP | 2000-017148 | 1/2000 |
| JP | 2001-011415 | 1/2001 |
| JP | 2001-316564 | 11/2001 |
| JP | 2002-212390 | 7/2002 |
| JP | 2003-011269 | 1/2003 |
| JP | 2003-147171 | 5/2003 |
| JP | 2004-115552 | 4/2004 |
| JP | 2007-231125 | 9/2007 |
| JP | 2007-254709 | 10/2007 |
| JP | 2007-302843 | 11/2007 |
| JP | 2009-245938 | 10/2009 |
| JP | 2016-53151 A | 4/2016 |
| WO | 01/18115 A1 | 3/2001 |
| WO | 2007/142140 A1 | 12/2007 |
| WO | 2008/093579 A1 | 8/2008 |
| WO | 2008153208 | 12/2008 |

OTHER PUBLICATIONS

Nasar, et al, Synthesis and Properties of Imidazole-Blocked Diisocyanates, Polymer International, vol. 48, Issue 7, pp. 614-620.

Japanese Official Action, dated Jun. 10, 2014, for JP Application No. 2010-066353.

Office Action dated Sep. 25, 2015 for Chinese Application 201310506675.9.

Machine translation of JP 63-077928 to Kanayama et al.

Michael Sefkow et al., "Bisphenole", Thieme ROMPP, https://roempp.thieme.de/roempp4.0/do/data/RD-02-01737, 3 pages.

Communication pursuant to Article 94(3) EPC, dated Apr. 23, 2018, for European App. No. 10 756 229.0-1102.

* cited by examiner

THERMOSETTING RESIN COMPOSITION, AND PREPREG, INSULATING FILM WITH SUPPORT, LAMINATE PLATE, AND PRINTED WIRING BOARD, EACH OBTAINED USING SAME

CROSS-REFERENCE TO RELATED APPLICATIONS

This Application is a continuation of U.S. application Ser. No. 13/258,763, filed Dec. 19, 2011, abandoned, the entire contents of which are incorporated herein by reference. Ser. No. 13/258,763 is an application filed under 35 USC 371 of PCT/JP2010/055392.

TECHNICAL FIELD

The present invention relates to a thermosetting resin composition suitable for a semiconductor package and a printed wiring board, and a prepreg, an insulating film with a support, a laminate plate and a printed wiring board, each containing the same.

BACKGROUND ART

Associated with further progress of miniaturization, weight saving and multifunctionality of electronic devices in recent years, integration of LSI and other chip devices proceeds, and the configurations thereof are rapidly changed to ones with an increased number of pins and a reduced size. Accordingly, a multilayer printed wiring board therefor is being developed to have a fine wiring structure for enhancing the mounting density of electronic parts.

As a production method of a multilayer printed wiring board satisfying the demands, a build-up method has been known and is becoming a mainstream of the technique suitable for weight saving, miniaturization and fine structure.

There is an active movement of restricting a material that has possibility of generating a harmful substance upon combustion including electronic parts, according to increase of the environmental conservation awareness. An ordinary multilayer printed wiring board uses a bromine compound for achieving flame retardancy but has possibility of generating a harmful substance upon combustion, and therefore it is expected that the bromine compound may not be used in the near future.

Lead-free solder containing no lead is being practically used as solder that is generally used for connecting the electronic parts to a multilayer printed wiring board. The lead-free solder is used at a temperature that is higher by approximately from 20 to 30° C. than that for ordinary eutectic solder, and therefore the materials necessarily have higher heat resistance.

In the multilayer printed wiring board having the build-up structure, via holes are being filled or having a stack, associated with the increase of the number of layers, for enhancing the density. For decreasing the thickness of the multilayer printed wiring board, however, an insulating resin layer containing no glass cloth has a tendency of having an increased thermal expansion coefficient, and the difference in thermal expansion coefficient from copper in a via hole being filled or having a stack largely affects the reliability of connection, which may be fears about reliability. Under the circumstances, a material that has a small thermal expansion coefficient is being demanded for the insulating resin layer.

For decreasing the thermal expansion coefficient of the insulating resin layer, such a method has been employed that an inorganic filler having a small thermal expansion coefficient is filled in a large amount, thereby decreasing the thermal expansion coefficient of the entire insulating layer (see, for example, Patent Document 1). However, the method may cause various problems including decrease of the fluidity and decrease of the insulation reliability.

There are attempts for achieving low thermal expansion by selecting or improving the resins. For example, there is a resin composition for press molding having low thermal expansion property using an epoxy resin having a bifunctional naphthalene skeleton or biphenyl skeleton as an example of an epoxy resin having an aromatic ring (see Patent Document 2), in which the filler is filled in an amount of from 80 to 92.5% by volume. Furthermore, decrease of thermal expansion property of a resin composition for a wiring board has been generally achieved by increasing the crosslinking density and increasing the glass transition temperature (Tg) (see Patent Documents 3 and 4). However, the increase of the crosslinking density requires shortening the molecular chain between the functional groups, and it is difficult to shorten the molecular chain beyond a certain length from the standpoint of the reactivity, the strength of the resin, and the like.

There is an attempt of introducing an imide skeleton, which is considered to be effective for achieving heat resistance and low thermal expansion, and for example, a thermosetting composition for build-up using an aromatic diamine having an imide group and an epoxy resin has been proposed (see Patent Document 5). However, in the case where a low molecular weight polyimide compound is used as a curing agent of the epoxy resin, the characteristics of the composition may have substantially no difference from those of the epoxy resin in many cases.

A laminate plate for a printed wiring board is ordinarily a laminate plate formed by curing and integratedly molding a resin composition containing an epoxy resin as a major ingredient with a glass woven cloth. The epoxy resin is excellent in balance among the insulating property, the heat resistance, the cost and the like, but has a limitation in enhancing the heat resistance for addressing the demand of increased heat resistance associated with the high density mounting and the highly multilayered structure of the printed wiring board in recent years.

Patent Document 2 described above achieves low thermal expansion by selecting an epoxy resin having an aromatic ring and filling an inorganic filler, such as silica, to a high density, since an epoxy resin has a large thermal expansion coefficient. However, it has been known that the increase of the filled amount of the inorganic filler results in decrease of the insulation reliability, insufficient adhesion between the resin and the wiring layer, and failure on press molding due to moisture absorption.

A polybismaleimide resin, which has been widely used in a high density mounting and highly multilayered laminate plate, is excellent in heat resistance, but has high hygroscopicity and a problem on adhesion. Furthermore, as compared to an epoxy resin, the polybismaleimide resin has a defect of low productivity since a high temperature and a prolonged period of time are required upon lamination. Specifically, an ordinary epoxy resin may be cured at a temperature of 180° C. or lower, but lamination of the polybismaleimide resin requires a process with a high temperature of 220° C. or higher for a prolonged period of time.

Accordingly, there have been proposals of using a modified imide resin containing a polybismaleimide resin modified with an epoxy resin having a naphthalene skeleton (see, for example, Patent Document 6). The modified imide resin is improved in hygroscopicity and adhesion property. However, the modified imide resin is obtained by modifying with a low molecular weight compound containing a hydroxyl group and an epoxy group for imparting solubility to a common solvent, such as methyl ethyl ketone, and thus the resulting modified imide resin is largely inferior in heat resistance as compared to the polybismaleimide resin.

A varnish and a prepreg of a resin composition for a printed wiring board are required to have storage stability, and thus necessarily use such a material that has high potential reactivity to a curing agent and a curing accelerator (reaction potential), but achieves long term storage of the resin composition. In the phenol curing system and the aromatic amine curing system, an imidazole compound may be favorably used as a curing accelerator, but these are insufficient in reaction potential and are difficult to be stored for a prolonged period of time.

RELATED ART DOCUMENTS

Patent Documents

Patent Document 1: JP-A-2004-182851
Patent Document 2: JP-A-5-148343
Patent Document 3: JP-A-2000-243864
Patent Document 4: JP-A-2000-114727
Patent Document 5: JP-A-2000-17148
Patent Document 6: JP-A-6-263843

SUMMARY OF THE INVENTION

Problems to be Solved by the Invention

Under the circumstances, an object of the present invention is to provide a thermosetting resin composition that has favorable resin curing property, i.e., requires no process with a high temperature and a prolonged period of time upon laminating a prepreg, has favorable curing property and storage stability as a varnish and a prepreg, and is excellent in chemical resistance, heat resistance and adhesiveness, and to provide a prepreg, an insulating film with a support, a laminate plate and a printed wiring board, each containing the resin composition.

Another object of the present invention is to provide a thermosetting resin composition that has low warping property, in addition to the aforementioned advantages, and to provide a prepreg, an insulating film with a support, a laminate plate and a printed wiring board, each containing the resin composition.

Means for Solving the Problems

As a result of earnest investigations to solve the above problems, it has been found in the present invention that favorable resin curing property and storage stability are obtained to achieve the aforementioned objects by using (C) a particular modified imidazole compound in (A) a resin composition having an unsaturated maleimide group, produced by reacting a maleimide compound and an amine compound (which may be referred to as a compound (A)) and (B) a thermosetting resin, and thus the present invention has been achieved. The present invention has been completed based on the findings.

The present invention provides a thermosetting resin composition, and a prepreg, an insulating film with a support, a laminate plate and a printed wiring board, each containing the resin composition.

(1) A thermosetting resin composition containing: (A) a resin composition having an unsaturated maleimide group, produced by reacting (a) a maleimide compound having at least two N-substituted maleimide groups per one molecule and (b) an amine compound having at least two primary amino groups per one molecule; (B) a thermosetting resin; and (C) a modified imidazole compound represented by any one of the following general formulae (I) to (III):

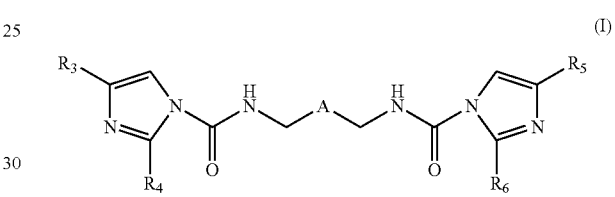

wherein $R_3$, $R_4$, $R_5$ and $R_6$ each independently represent a hydrogen atom, an aliphatic hydrocarbon group having from 1 to 20 carbon atoms or a phenyl group; and A represents an alkylene group or an aromatic hydrocarbon group,

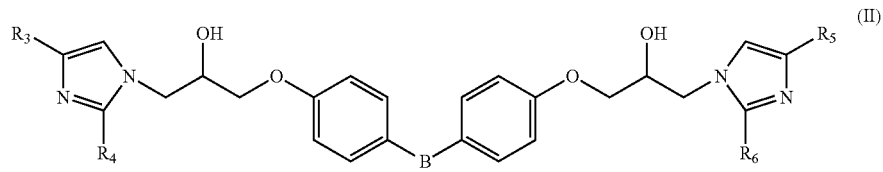

wherein $R_3$, $R_4$, $R_5$ and $R_6$ each independently represent a hydrogen atom, an aliphatic hydrocarbon group having from 1 to 20 carbon atoms or a phenyl group; and B represents a single bond, an alkylene group, an alkylidene group, an ether group or a sulfonyl group,

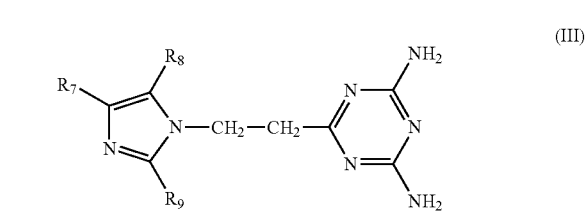

wherein $R_7$ and $R_8$ each independently represent a hydrogen atom, an aliphatic hydrocarbon group having from 1 to 20 carbon atoms, a hydroxymethyl group or a phenyl group;

and R₉ represents a hydrogen atom, an aliphatic hydrocarbon group having from 1 to 20 carbon atoms, a phenyl group or an allyl group.

(2) The thermosetting resin composition according to the item (1), wherein the thermosetting resin composition further contains (D) an amine compound having an acidic substituent represented by the following general formula (IV):

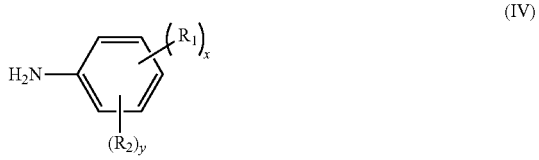

wherein $R_1$ each independently represent a hydroxyl group, a carboxyl group or a sulfonic acid group as the acidic substituent; $R_2$ each independently represent a hydrogen atom, an aliphatic hydrocarbon group having from 1 to 5 carbon atoms or a halogen atom; x represents an integer of from 1 to 5; and y represents an integer of from 0 to 4, provided that a sum of x and y is 5.

(3) The thermosetting resin composition according to the item (1) or (2), wherein the thermosetting resin composition further contains (E) an inorganic filler.

(4) The thermosetting resin composition according to any one of the items (1) to (3), wherein the thermosetting resin composition further contains (F) a molybdenum compound.

(5) The thermosetting resin composition according to any one of the items (1) to (4), wherein the thermosetting resin composition further contains (G) a phosphorus-containing compound that imparts flame retardancy.

(6) The thermosetting resin composition according to any one of the items (1) to (5), wherein the thermosetting resin composition further contains (H) a compound that achieves chemical roughening.

(7) The thermosetting resin composition according to any one of the items (1) to (6), wherein the thermosetting resin (B) is at least one selected from an epoxy resin, a phenol resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin and a melamine resin.

(8) The thermosetting resin composition according to any one of the items (3) to (7), wherein the inorganic filler (E) is fused spherical silica and/or a metal hydrate that has a thermal decomposition temperature of 300° C. or more.

(9) An insulating film with a support containing a support having formed on a surface thereof a film containing the thermosetting resin composition according to any one of the items (1) to (8) in a semi-cured state.

(10) A prepreg containing the thermosetting resin composition according to any one of the items (1) to (8) that is coated on a reinforcing substrate in a form of a fiber sheet, and is rendered into a B-stage.

(11) A laminate plate containing at least one sheet of the insulating film with a support according to the item (9), the prepreg according to the item (10), or both of them.

(12) A printed wiring board containing the laminate plate according to the item (11).

Advantages of the Invention

A resin varnish obtained by using the thermosetting resin composition of the present invention has favorable curing property and storage stability, a prepreg obtained therewith has favorable curing property and requires no process with a high temperature and a prolonged period of time upon lamination, and a laminate plate thus obtained is excellent in chemical resistance, heat resistance and adhesiveness, and thus they may be favorably used as a material for electric and electronic devices using the same. Furthermore, a thermosetting resin composition that has low warping property, in addition to the aforementioned advantages, and a prepreg, an insulating film with a support, a laminate plate and a printed wiring board, each containing the resin composition, are also provided.

MODE FOR CARRYING OUT THE INVENTION

The present invention will be described in detail below.

The thermosetting resin composition of the present invention contains: (A) a resin composition having an unsaturated maleimide group, produced by reacting (a) a maleimide compound having at least two N-substituted maleimide groups per one molecule and (b) an amine compound having at least two primary amino groups per one molecule; (B) a thermosetting resin; and (C) a modified imidazole compound represented by any one of the general formulae (I) to (III) described later.

The resin composition having an unsaturated maleimide group (A) is produced by reacting (a) a maleimide compound having at least two N-substituted maleimide groups per one molecule and (b) an amine compound having at least two primary amino groups per one molecule. The reaction is performed preferably in an organic solvent.

Examples of the maleimide compound having at least two N-substituted maleimide groups per one molecule (a) include N,N'-ethylenebismaleimide, N,N'-hexamethylenebismaleimide, N,N'-(1,3-phenylene)bismaleimide, N,N'-(1,3-(2-methylphenylene))bismaleimide, N,N'-(1,3-(4-methylphenylene))bismaleimide, N,N'-(1,4-phenylene)bismaleimide, bis(4-maleimidophenyl)methane, bis(3-methyl-4-maleimidophenyl)methane, 3,3-dimethyl-5,5-diethyl-4,4-diphenylmethanebismaleimide, bis(4-maleimidophenyl) ether, bis(4-maleimidophenyl) sulfone, bis(4-maleimidophenyl)sulfide, bis(4-maleimidophenyl) ketone, bis(4-maleimidocyclohexyl)methane, 1,4-bis(4-maleimidophenyl)cyclohexane, 1,4-bis(maleimidomethyl)cyclohexane, 1,4-bis(maleimidomethyl)benzene, 1,3-bis(4-maleimidophenoxy)benzene, 1,3-bis(3-maleimidophenoxy)benzene, bis[4-(3-maleimidophenoxy)phenyl]methane, bis[4-(4-maleimidophenoxy)phenyl]methane, 1,1-bis[4-(3-maleimidophenoxy)phenyl]ethane, 1,1-bis[4-(4-maleimidophenoxy)phenyl]ethane, 1,2-bis[4-(3-maleimidophenoxy)phenyl]ethane, 1,2-bis[4-(4-maleimidophenoxy)phenyl]ethane, 2,2-bis[4-(3-maleimidophenoxy)phenyl]propane, 2,2-bis[4-(4-maleimidophenoxy)phenyl]propane, 2,2-bis[4-(3-maleimidophenoxy)phenyl]butane, 2,2-bis[4-(4-maleimidophenoxy)phenyl]butane, 2,2-bis[4-(3-maleimidophenoxy)phenyl]-1,1,1,3,3,3-hexafluoropropane, 2,2-bis[4-(4-maleimidophenoxy)phenyl]-1,1,1,3,3,3-hexafluoropropane, 4,4-bis(3-maleimidophenoxy)biphenyl, 4,4-bis(4-maleimidophenoxy)biphenyl, bis[4-(3-maleimidophenoxy)phenyl]ketone, bis[4-(4-maleimidophenoxy)phenyl]ketone, 2,2'-bis(4-maleimidophenyl)disulfide, bis[4-maleimidophenyl]disulfide, bis[4-(3-maleimidophenoxy)phenyl]sulfide, bis[4-(4-maleimidophenoxy)phenyl]sulfide, bis[4-(3-maleimidophenoxy)phenyl]sulfoxide, bis[4-(4-maleimidophenoxy)phenyl]sulfoxide, bis[4-(3-maleimidophenoxy)phenyl]sulfone, bis[4-(4-maleimidophenoxy)phenyl]

sulfone, bis[4-(3-maleimidophenoxy)phenyl]ether, bis[4-(4-maleimidophenoxy)phenyl]ether, 1,4-bis[4-(4-maleimidophenoxy)-α,α-dimethylbenzyl]benzene, 1,3-bis[4-(4-maleimidophenoxy)-α,α-dimethylbenzyl]benzene, 1,4-bis[4-(3-maleimidophenoxy)-α,α-dimethylbenzyl]benzene, 1,3-bis[4-(3-maleimidophenoxy)-α,α-dimethylbenzyl]benzene, 1,4-bis[4-(4-maleimidophenoxy)-3,5-dimethyl-α,α-dimethylbenzyl]benzene, 1,3-bis[4-(4-maleimidophenoxy)-3,5-dimethyl-α,α-dimethylbenzyl]benzene, 1,4-bis[4-(3-maleimidophenoxy)-3,5-dimethyl-α,α-dimethylbenzyl]benzene, 1,3-bis[4-(3-maleimidophenoxy)-3,5-dimethyl-α,α-dimethylbenzyl]benzene, and polyphenylmethanemaleimide represented by the following general formula (A) (for example, BMI-2300, a trade name, produced by Daiwa Fine Chemicals Co., Ltd.), and these maleimide compounds may be used solely or as a mixture of two or more kinds thereof.

Among these, bis(4-maleimidophenyl)methane, bis(4-maleimidophenyl) sulfone, N,N'-(1,3-phenylene)bismaleimide, 2,2-bis(4-(4-maleimidophenoxy)phenyl)propane and polyphenylmethanemaleimide are preferred since these compounds have a high reaction rate to provide higher heat resistance, and bis(4-maleimidophenyl) methane is particularly preferred from the standpoint of the solubility in a solvent.

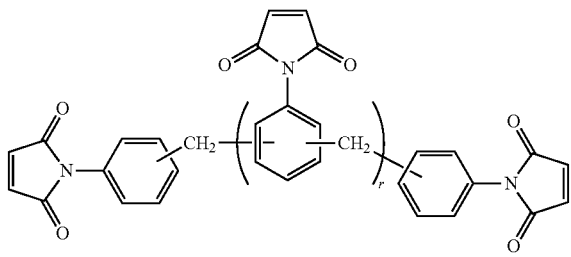

(A)

wherein r represents an integer of from 1 to 10.

The amine compound having at least two primary amino groups per one molecule (b) is not particularly limited, and examples thereof include an aromatic amine compound, such as m-phenylenediamine, p-phenylenediamine, 4,6-dimethyl-m-phenylenediamine, 2,5-dimethyl-p-phenylenediamine, 2,3,5,6-tetramethyl-p-phenylenediamine, 2,4-diaminomesitylene, m-xylene-2,5-diamine, m-xylylenediamine, p-xylylenediamine, 2,4-diaminotoluene, 2,5-diaminotoluene, 2,4-bis(amino-t-butyl)toluene, 2,4-diaminoxylene, 2,4-diaminopyridine, 2,6-diaminopyridine, 2,5-diaminopyridine, 2,4-diaminodurene, 4,5-diamino-6-hydroxy-2-mercaptopyrimidine, 3-bis(3-aminobenzyl)benzene, 4-bis(4-aminobenzyl)benzene, 1,4-bis(4-aminophenyl)benzene, 1,3-bis(3-aminophenoxy)benzene, 1,3-bis(4-aminophenoxy)benzene, 1,4-bis(4-aminophenoxy)benzene, 3-bis(3-(3-aminophenoxy)phenoxy)benzene, 4-bis(4-(4-aminophenoxyl)phenoxy)benzene, 3-bis(3-(3-(3-aminophenoxyl)phenoxy)phenoxy)benzene, 4-bis(4-(4-(4-aminophenoxyl)phenoxy)phenoxy)benzene, 3-bis(α,α-dimethyl-3-aminobenzyl)benzene, 1,4-bis(α,α-dimethyl-3-aminobenzyl)benzene, 3-bis(α,α-dimethyl-4-aminobenzyl)benzene, bis(4-methylaminopentyl)benzene, p-bis(2-methyl-4-aminopentyl)benzene, 1,4-bis(3-aminopropyldimethylsilyl)benzene, bis[(4-aminophenyl)-2-propyl]-1,4-benzene, 2,5-diaminobenzenesulfonic acid, 3,3'-diaminodiphenylmethane, 4,4'-diaminodiphenylmethane, 3,3'-dimethyl-4,4'-diaminodiphenylmethane, 3,3',5,5'-tetramethyl-4,4'-diaminodiphenylmethane, 3,3'-diethyl-4,4'-diaminodiphenylmethane, 3,3'-dimethyl-5,5'-diethyl-4,4'-diaminodiphenylmethane, 4,4'-methylene-bis(2-chloroaniline), 3,3'-diaminodiphenylethane, 4,4'-diaminodiphenylethane, 2,2'-diaminodiphenylpropane, 3,3'-diaminodiphenylpropane, 4,4'-diaminodiphenylpropane, 2,2'-bis[4-(4-aminophenoxyl)phenyl]propane, 2,2'-bis[4-(4-aminophenoxyl)phenyl]hexafluoropropane, 3-(2',4'-diaminophenoxyl)propanesulfonic acid, bis(4-aminophenyl) diethylsilane, 3,3'-diaminobenzophenone, 4,4'-diaminobenzophenone, 3,3'-diaminodiphenyl ether, 4,4'-diaminodiphenyl ether, 3,3'-dimethyl-4,4'-diaminodiphenyl ether, bis(4-amino-t-butylphenyl) ether, 4,4'-diaminodiphenyl ether-2,2'-disulfonic acid, 3,3'-diaminodiphenyl sulfone, 4,4'-diaminodiphenyl sulfone, bis[4-(4-aminophenoxyl)phenyl]sulfone, bis[4-(3-aminophenoxy)phenyl]sulfone, benzidine, 2,2'-dimethyl-4,4'-diaminobiphenyl, 3,3'-dimethyl-4,4'-diaminobiphenyl, 3,3'-dimethoxy-4,4'-diaminobiphenyl, 3,3'-dimethyl-4,4'-diaminobiphenyl-6,6'-disulfonic acid, 2,2',5,5'-tetrachloro-4,4'-diaminobiphenyl, 3,3'-dichloro-4,4'-diaminobiphenyl, 3,3'-dichloro-4,4'-diaminobiphenyl, 4,4'-bis(4-aminophenoxy)biphenyl, 4,4'-diaminodiphenyl sulfide, 4,4'-diamino-3,3'-biphenyldiol, 1,5-diaminonaphthalene, 1,4-diaminonaphthalene, 2,6-diaminonaphthalene, 9,9'-bis(4-aminophenyl)fluorene, 9,9'-bis(4-aminophenyl)fluorene-2,7-disulfonic acid, 9,9'-bis(4-aminophenoxyphenyl)fluorene, diaminoanthraquinone and 3,7-diamino-2,8-dimethyldibenzothiophene sulfone; an aliphatic amine compound, such as ethylenediamine, tetramethylenediamine, pentamethylenediamine, hexamethylenediamine, heptamethylenediamine, octamethylenediamine, nonamethylenediamine, decamethylenediamine, 2,5-dimethylhexamethylenediamine, 3-methoxyhexamethylenediamine, 2,5-dimethylheptamethylenediamine, 3-methylheptamethylenediamine, 4,4-dimethylheptamethylenediamine, 5-methylnonamethylenediamine, 1,4-diaminocyclohexane, 1,3-bis(3-aminopropyl)tetramethyldisiloxane, diaminopolysiloxane, 2,5-diamino-1,3,4-oxadiazole and bis(4-aminocyclohexyl)methane; and a guanamine compound, such as melamine, benzoguanamine, acetoguanamine, 2,4-diamino-6-vinyl-s-triazine, 2,4-diamino-6-allyl-s-triazine, 2,4-diamino-6-acryloyloxyethyl-s-triazine and 2,4-diamino-6-methacryloyloxyethyl-s-triazine.

Among these, as the amine compound having at least two primary amino groups per one molecule (b), m-phenylenediamine, p-phenylenediamine, 1,4-bis(4-aminophenoxy)benzene, 4,4'-diaminodiphenylmethane, 3,3'-dimethyl-4,4'-diaminodiphenylmethane, 3,3'-diethyl-4,4'-diaminodiphenylmethane, 2,2'-bis[4-(4-aminophenoxyl)phenyl]propane, 4,4'-diaminobenzophenone, 4,4'-diaminodiphenyl ether, 4,4'-diaminodiphenyl sulfone, bis[4-(4-aminophenoxyl)phenyl]sulfone, benzidine, 4,4'-bis(4-aminophenoxy)biphenyl, 4,4'-diaminodiphenyl sulfide and 4,4'-diamino-3,3'-biphenyldiol, which are aromatic amine compounds, and benzoguanamine, which is a guanamine compound, are preferred since these compounds provide favorable reactivity and heat resistance; p-phenylenediamine, 4,4'-diaminodiphenylmethane, 4,4'-diaminodiphenyl ether, 4,4'-diaminodiphenyl sulfone, 3,3'-dimethyl-4,4'-diaminodiphenylmethane, 3,3'-diethyl-4,4'-diaminodiphenylmethane and benzoguanamine are more preferred since these compounds are inexpensive; and 4,4'-diaminodiphenylmethane is particularly preferred from the standpoint of the solubility in a solvent. These compounds may be used solely or as a mixture of two or more kinds thereof.

The organic solvent used in the reaction of the maleimide compound (a) and the amine compound (b) is not particularly limited, and examples thereof include an alcohol solvent, such as ethanol, propanol, butanol, methyl cellosolve, butyl cellosolve and propylene glycol monomethyl ether, a ketone solvent, such as acetone, methyl ethyl ketone, methyl isobutyl ketone and cyclohexanone, an ester solvent, such as ethyl acetate and γ-butyrolactone, an ether solvent, such as tetrahydrofuran, an aromatic solvent, such as toluene, xylene and mesitylene, a nitrogen atom-containing solvent, such as dimethylformamide, dimethylacetamide and N-methylpyrrolidone, and a sulfur atom-containing solvent, such as dimethylsulfoxide, which may be used solely or as a mixture of two or more kinds thereof.

Among these, cyclohexanone, propylene glycol monomethyl ether, methyl cellosolve and γ-butyrolactone are preferred from the standpoint of the solubility, and cyclohexanone, propylene glycol monomethyl ether and dimethylacetamide are particularly preferred since these solvents have low toxicity, and have high volatility, which prevents the solvents from remaining.

The maleimide compound (a) and the amine compound (b) are preferably used in a ratio that satisfies the equivalent ratio $(T_a/T_b)$ in a range of $1.0<(T_a/T_b)\leq10.0$, and more preferably in a range of $2.0\leq(T_a/T_b)\leq10.0$, wherein $(T_a/T_b)$ is the equivalent ratio of the equivalent $(T_a)$ of the maleimide group in the maleimide compound (a) to the equivalent $(T_b)$ of the —NH$_2$ group in the amine compound (b). The equivalent ratio $(T_a/T_b)$ that is in the range provides the thermosetting resin composition excellent in storage stability, solubility in an organic solvent, adhesiveness to a copper foil, and heat resistance.

The amount of the organic solvent used is preferably from 10 to 1,000 parts by mass, more preferably from 100 to 500 parts by mass, and particularly preferably from 200 to 500 parts by mass, per 100 parts by mass of the total amount of the maleimide compound (a) and the amine compound (b). When the amount of the organic solvent is in the range, the solubility in an organic solvent may not be insufficient, and the reaction may be performed within a short period of time.

The reaction temperature of the maleimide compound (a) and the amine compound (b) is preferably from 50 to 200° C., and particularly preferably from 70 to 160° C. The reaction time is preferably from 0.1 to 10 hours, and particularly preferably from 1 to 6 hours.

A reaction catalyst may be arbitrarily used in the reaction. Examples of the reaction catalyst include an amine compound, such as triethylamine, pyridine and tributylamine, an imidazole compound, such as methylimidazole and phenylimidazole, and a phosphorus catalyst, such as triphenylphosphine, which may be used solely or as a mixture of two or more kinds thereof.

The reaction method is not particularly limited, and for example, the reaction may be performed with a reaction apparatus equipped with an agitator and a reflux condenser under refluxing, thereby producing the resin composition having an unsaturated maleimide group (A).

Examples of the thermosetting resin (B) include an epoxy resin, a phenol resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin and a melamine resin, which may be used solely or as a mixture of two or more kinds thereof.

Among these, an epoxy resin and a cyanate resin are preferred from the standpoint of the moldability and the electric insulating property.

Examples of the epoxy resin include a bisphenol A type epoxy resin, a bisphenol F type epoxy resin, a bisphenol S type epoxy resin, a phenol novolak type epoxy resin, a cresol novolak type epoxy resin, a bisphenol A novolak type epoxy resin, a bisphenol F novolak type epoxy resin, a stilbene type epoxy resin, a triazine skeleton-containing epoxy resin, a fluorene skeleton-containing epoxy resin, a triphenolphenolmethane type epoxy resin, a biphenyl type epoxy resin, a xylylene type epoxy resin, a biphenyl aralkyl type epoxy resin, a naphthalene type epoxy resin, a dicyclopentadiene type epoxy resin, an alicyclic epoxy resin, a diglycidyl ether compound of a polyfunctional phenol compound and a polycyclic aromatic compound, such as anthracene, and phosphorus-containing epoxy resins having a phosphorus compound introduced thereto, and among these, a biphenyl aralkyl type epoxy resin and a naphthalene type epoxy resin are preferred from the standpoint of the heat resistance and the flame retardancy. These compounds may be used solely or as a mixture of two or more kinds thereof.

Examples of the cyanate resin include a bisphenol type cyanate resin, such as a novolak type cyanate resin, a bisphenol A type cyanate resin, a bisphenol E type cyanate resin and a tetramethylbisphenol F type cyanate resin, and prepolymers obtained by partially forming them into a triazine moiety. Among these, a novolak type cyanate resin is preferred from the standpoint of the heat resistance and the flame retardancy. These compounds may be used solely or as a mixture of two or more kinds thereof.

The thermosetting resin composition of the present invention contains (C) a particular modified imidazole compound, in addition to the resin composition having an unsaturated maleimide group (A) and the thermosetting resin (B), thereby providing the thermosetting resin composition that requires no process with a high temperature and a prolonged period of time upon laminating a prepreg, has favorable stability as a varnish and a prepreg, and is excellent in chemical resistance, heat resistance and adhesiveness.

In the thermosetting resin composition of the present invention, at least one of an isocyanate-masked imidazole represented by the following general formula (I), an epoxy-masked imidazole represented by the general formula (II) and a triazine ring-containing imidazole represented by the general formula (III) is particularly used as the modified imidazole compound (C).

Examples of the isocyanate-masked imidazole represented by the general formula (I) include G8009L, a trade name, produced by Dai-ichi Kogyo Seiyaku Co., Ltd., and examples of the epoxy-masked imidazole represented by the general formula (II) include P200H50, a trade name, produced by Japan Epoxy Resin Co., Ltd. Examples of the triazine ring-containing imidazole represented by the general formula (III) include 2MZ-A, 2MZA-PW, C11Z-A and 2E4MZ-A, trade names, produced by Shikoku Chemicals Corporation.

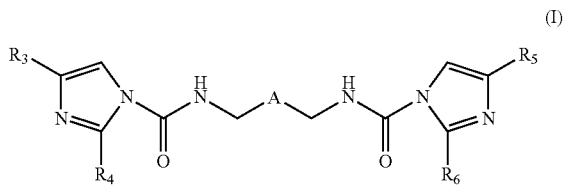

(I)

wherein R$_3$, R$_4$, R$_5$ and R$_6$ each independently represent a hydrogen atom, an aliphatic hydrocarbon group having from 1 to 20 carbon atoms or a phenyl group; and A represents an alkylene group of an aromatic hydrocarbon group,

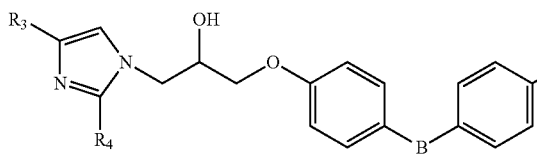

wherein $R_3$, $R_4$, $R_5$ and $R_6$ each independently represent a hydrogen atom, an aliphatic hydrocarbon group having from 1 to 20 carbon atoms or a phenyl group; and B represents a single bond, an alkylene group, an alkylidene group, an ether group or a sulfonyl group,

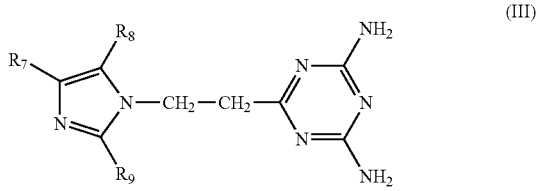

wherein $R_7$ and $R_8$ each independently represent a hydrogen atom, an aliphatic hydrocarbon group having from 1 to 20 carbon atoms, a hydroxymethyl group or a phenyl group; and $R_9$ represents a hydrogen atom, an aliphatic hydrocarbon group having from 1 to 20 carbon atoms, a phenyl group or an allyl group.

The number of kinds of the modified imidazole compound (C) used is not limited. The amount of the modified imidazole compound (C) used is preferably from 0.01 to 10 parts by mass per 100 parts by mass of the thermosetting resin (B). When the amount is 0.01 part by mass or more, favorable curing property may be obtained, and when the amount is 10 parts by mass or less, more favorable storage stability may be obtained.

The thermosetting resin composition of the present invention may further contain (D) an amine compound having an acidic substituent represented by the following general formula (IV). In this case, it is preferred to react the resin composition (A) having an unsaturated maleimide group with the amine compound (D) in an organic solvent before mixing the thermosetting resin composition and prepare as a prepolymer.

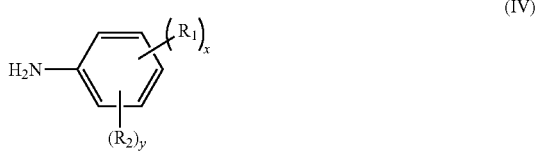

wherein $R_1$ each independently represent a hydroxyl group, a carboxyl group or a sulfonic acid group as the acidic substituent; $R_2$ each independently represent a hydrogen atom, an aliphatic hydrocarbon group having from 1 to 5 carbon atoms or a halogen atom; x represents an integer of from 1 to 5; and y represents an integer of from 0 to 4, provided that a sum of x and y is 5.

Examples of the amine compound having an acidic substituent (D) represented by the following general formula 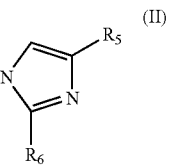 (IV) include m-aminophenol, p-aminophenol, o-aminophenol, p-aminobenzoic acid, m-aminobenzoic acid, o-aminobenzoic acid, o-aminobenzenesulfonic acid, m-aminobenzenesulfonic acid, p-aminobenzenesulfonic acid, 3,5-dihydroxyaniline and 3,5-dicarboxyaniline. Among these, m-aminophenol, p-aminophenol, o-aminophenol, p-aminobenzoic acid, m-aminobenzoic acid and 3,5-dihydroxyaniline are preferred from the standpoint of the solubility and the yield on synthesis, m-aminophenol and p-aminophenol are more preferred from the standpoint of the heat resistance, and m-aminophenol is particularly preferred owing to the low toxicity thereof.

An organic solvent used in the reaction of the resin composition having an unsaturated maleimide group (A) and the amine compound (D) may be the similar solvent as used in the reaction of the maleimide compound (a) and the amine compound (b), and it is preferred that the resin composition having an unsaturated maleimide group (A), which is produced by reacting the maleimide compound (a) and the amine compound (b) in an organic solvent, is reacted with the amine compound having an acidic substituent (D) represented by the general formula (IV), thereby preparing a prepolymer, which is then mixed in the thermosetting resin composition.

The resin composition having an unsaturated maleimide group (A) and the amine compound having an acidic substituent (D) are preferably used in a ratio that satisfies the equivalent ratio $(T_A/T_D)$ in a range of $1.0<(T_A/T_D)\leq10.0$, and more preferably in a range of $2.0\leq(T_A/T_D)\leq10.0$, wherein $(T_A/T_D)$ is the equivalent ratio of the equivalent $(T_A)$ of the maleimide group of the resin composition (A) to the equivalent $(T_D)$ of the —$NH_2$ group in the amine compound (D). The equivalent ratio $(T_A/T_D)$ that is in the range provides the thermosetting resin composition excellent in storage stability, solubility in an organic solvent, adhesiveness to a copper foil, and heat resistance.

The amount of the organic solvent used is preferably from 10 to 1,000 parts by mass, more preferably from 100 to 500 parts by mass, and particularly preferably from 200 to 500 parts by mass, per 100 parts by mass of the total amount of the resin composition having an unsaturated maleimide group (A) and the amine compound having an acidic substituent (D). When the amount of the organic solvent is in the range, the solubility in an organic solvent may not be insufficient, and the reaction may be performed within a short period of time.

The reaction temperature of the resin composition having an unsaturated maleimide group (A) and the amine compound having an acidic substituent (D) is preferably from 50 to 200° C., and particularly preferably from 70 to 160° C. The reaction time is preferably from 0.1 to 10 hours, and particularly preferably from 1 to 6 hours.

A reaction catalyst may be arbitrarily used in the reaction. The reaction catalyst is not particularly limited, and examples thereof include an amine compound, such as triethylamine, pyridine and tributylamine, an imidazole compound, such as methylimidazole and phenylimidazole, and a phosphorus catalyst, such as triphenylphosphine, which may be used solely or as a mixture of two or more kinds thereof.

The thermosetting resin composition of the present invention preferably contains (E) an inorganic filler for enhancing the heat resistance and decreasing the thermal expansion coefficient.

Examples of the inorganic filler (E) include silica, alumina, talc, mica, kaolin, aluminum hydroxide, boehmite, magnesium hydroxide, zinc borate, zinc stannate, zinc oxide, titanium oxide, boron nitride, calcium carbonate, barium sulfate, aluminum borate, potassium titanate, and glass powder, hollow glass beads and the like of E-glass, T-glass, D-glass and the like, which may be used solely or as a mixture of two or more kinds thereof.

Among these, silica is particularly preferred from the standpoint of the dielectric characteristic, the heat resistance and the low thermal expansion property. Examples of the silica include precipitated silica having a high water content produced by a wet process, and dry process silica containing substantially no combined water or the like produced by a dry process, and examples of the dry process silica include pulverized silica, fumed silica and fused spherical silica, depending on the production methods.

Among these, fused spherical silica is preferred from the standpoint of the low thermal expansion property and the high fluidity upon mixing with the resin, and a metal hydrate that has a thermal decomposition temperature of 300° C. or more is preferred from the standpoint of the heat resistance. The use of both of them provides the thermosetting resin composition excellent in low thermal expansion property, heat resistance and flame retardancy.

In the case where fused spherical silica is used as the inorganic filler (E), the average particle diameter thereof is preferably from 0.1 to 10 μm, and more preferably from 0.3 to 8 μm. When the average particle diameter of the fused spherical silica is 0.1 μm or more, the fluidity upon filling in the resin highly densely may be maintained favorably, and when the average particle diameter is 10 μm or less, the probability of mixing coarse particles may be decreased, thereby preventing failure due to coarse particles from occurring. The average particle diameter referred herein is a particle diameter that corresponds to 50% by volume on the accumulated frequency distribution curve of the particle diameter with the total volume of the particles being 100%, and may be measured with a particle size distribution analyzer using a laser diffraction scattering method.

In the case where the thermosetting resin composition of the present invention contains the inorganic filler (E), the amount thereof is preferably from 10 to 60% by volume, and more preferably from 20 to 50% by volume, based on the total resin composition. When the content of the inorganic filler is from 10 to 60% by volume based on the total resin composition, the moldability and the low thermal expansion property of the thermosetting resin composition may be maintained favorably.

The thermosetting resin composition of the present invention preferably contains (F) a molybdenum compound for maintaining the adhesiveness of the resin composition favorably.

Examples of the molybdenum compound (F) include an oxide of molybdenum and a molybdic acid compound, such as molybdenum trioxide, zinc molybdate, ammonium molybdate, magnesium molybdate, calcium molybdate, barium molybdate, sodium molybdate, potassium molybdate, phosphomolybdic acid, ammonium phosphomolybdate, sodium phosphomolybdate and silicomolybdic acid, and a molybdenum compound, such as molybdenum boride, molybdenum disilicate, molybdenum nitride and molybdenum carbide, which may be used solely or as a mixture of two or more kinds thereof.

Among these, zinc molybdate, calcium molybdate and magnesium molybdate are preferred since these compounds have low water solubility and low toxicity, have high electric insulation property, and favorably prevent the drilling processability from being deteriorated. In the case where zinc molybdate, calcium molybdate and magnesium molybdate are used as the molybdenum compound, the use of the molybdenum compound supported on talc, silica, zinc oxide, calcium carbonate, magnesium hydroxide or the like may achieve prevention of precipitation and enhancement of dispersibility upon preparing a varnish by dissolving the resin composition in an organic solvent. Examples of the molybdenum compound include KEMGARD 911C and KEMGARD 1100, produced by Sherwin-Williams Company.

The content of the molybdenum compound (F) is preferably from 0.02 to 20% by volume, and more preferably from 0.1 to 15% by volume, based on the total resin composition. When the content of the molybdenum compound is from 0.02 to 20% by volume based on the total resin composition, the adhesiveness of the resin composition may be maintained favorably without deterioration of the drilling processability.

The thermosetting resin composition of the present invention may further contain (G) a phosphorus-containing compound that imparts flame retardancy, and a compound having a reactive functional group containing a phosphorus atom is preferred. The reactive functional group containing a phosphorus atom reacts with the functional group of at least one of the resin composition having an unsaturated maleimide group (A), the thermosetting resin, the modified imidazole compound (C) and the amine compound having an acidic substituent (D).

Examples of the phosphorus-containing compound that imparts flame retardancy (G) include a phosphorus-containing epoxy resin, a phosphorus-containing phenol resin, a phenoxyphosphazene compound, a condensation type phosphate ester compound and a diphosphinate salt. It is particularly effective to use these compounds in combination.

Among the commercially available phosphorus-containing compounds, examples of the compound that contains no reactive functional group include Exolit OP930 (a product name, produced by Clariant Japan Co., Ltd., phosphorus content: 23% by mass). Examples of the phosphorus-containing compound that contains a reactive functional group include FX-305 (a product name, produced by Tohto Kasei Co., Ltd., phosphorus content: ca. 3% by mass), which is a phosphorus-containing epoxy compound, HCA-HQ (a product name, produced by Sanko Co., Ltd., phosphorus content: ca. 9% by mass), which is a phosphorus-containing phenol compound, and phosphorus-containing phenol produced by a known method. Preferred examples of the phosphorus-containing phenol compound include phosphorus-containing phenol produced by the method disclosed in US Patent Publication No. 2007/0221890, which is preferred since the compound is soluble in a solvent, is difficult to form aggregates, and facilitates formation of fine wiring.

The resin composition of the present invention may further contain (H) a compound that achieves chemical roughening. The compound that achieves chemical roughening (H) is not limited as far as the compound forms a finely roughened profile on the surface of the insulating resin layer described later, through a desmear treatment, and is preferably crosslinked rubber particles or a polyvinyl acetal resin, and most preferably crosslinked rubber particles.

Examples of the crosslinked rubber particles include core-shell type rubber particles, crosslinked acrylonitrile-butadiene rubber particles, crosslinked styrene-butadiene rubber particles and acrylic rubber particles.

The core-shell type rubber particles are rubber particles that have a core layer and a shell layer, and examples thereof include ones having a two-layer structure, in which the shell layer as an outer layer is constituted by a glassy polymer, and the core layer as an inner layer is constituted by a rubber polymer, and ones having a three-layer structure, in which the shell layer as an outer layer is constituted by a glassy polymer, the intermediate layer is constituted by a rubber polymer, and the core layer is constituted by a glassy polymer. The glassy polymer layer may be constituted, for example, by a polymer of methyl methacrylate, and the rubber polymer layer may be constituted, for example, by a polymer of butyl acrylate (butyl rubber).

Specific examples of the core-shell type rubber particles include Stafiloid AC3832 and AC3816N (all trade names, produced by Ganz Chemical Co., Ltd.), Metablen KW-4426 (a trade name, produced by Mitsubishi Rayon Co., Ltd.) and EXL-2655 (a trade name, produced by Rhom and Haas).

Specific examples of the crosslinked acrylonitrile-butadiene rubber (NBR) particles include XER-91 (produced by JSR Corporation, average particle diameter: 0.5 µm).

Specific examples of the crosslinked styrene-butadiene rubber (SBR) particles include XSK-500 (produced by JSR Corporation, average particle diameter: 0.5 µm).

Specific examples of the acrylic rubber particles include Metablen W300A (average particle diameter: 0.1 µm) and W450A (average particle diameter: 0.2 µm) (all produced by Mitsubishi Rayon Co., Ltd.).

The crosslinked rubber particles may be used solely or as a combination of two or more kinds thereof.

The average particle diameter of the crosslinked rubber particles is preferably in a range of from 0.005 to 1 µm, and more preferably in a range of from 0.2 to 0.6 µm. The average particle diameter of the crosslinked rubber particles may be measured by a dynamic light scattering method. For example, the crosslinked rubber particles are uniformly dispersed in a suitable organic solvent with ultrasonic wave or the like, and the particle size distribution of the rubber particles is produced based on mass by using a concentrated system particle diameter analyzer (FPAR-1000, produced by Otsuka Electronics Co., Ltd.), the median diameter of which is designated as the average particle diameter.

The polyvinyl acetal resin is preferably one having a number average polymerization degree of from 1,000 to 2,500 while the kind, the hydroxyl group amount and the acetyl group amount thereof are not particularly limited. When the number average polymerization degree is in the range, the solder heat resistance may be ensured, and the varnish may be favorable in viscosity and handleability. The number average polymerization degree of the polyvinyl acetal resin may be determined, for example, from the number average molecular weight of polyvinyl acetate as the raw material thereof (which may be measured by gel permeation chromatography with the standard polystyrene calibration curve). A carboxylic acid-modified product thereof may also be used.

Examples of the polyvinyl acetal resin include S-Lec BX-1, BX-2, BX-5, BX-55, BX-7, BH-3, BH-S, KS-3Z, KS-5, KS-5Z, KS-8 and KS-23Z, trade names, produced by Sekisui Chemical Co., Ltd., and Denka Butyral 4000-2, 5000A, 6000C and 6000EP, trade names, produced by Denki Kagaku Kogyo K.K. The polyvinyl acetal resin may be used solely or as a mixture of two or more kinds thereof.

The phosphorus atom content derived from the phosphorus-containing compound (G) is preferably 2.0 parts by mass or less per 100 parts by mass of the resin component. The addition of the component (G) enhances the flame retardancy, and when the content is 2.0% by mass or less, enhancement of the glass transition temperature (Tg), decrease of the thermal expansion coefficient, and enhancement of the adhesiveness to a conductor layer, which are derived from the characteristics of the flame retardant, may be obtained.

The content of the compound that achieves chemical roughening (H) is preferably 5 parts by mass or less per 100 parts by mass of the resin component. The addition of the component (H) enhances the adhesion strength between the insulating resin layer and a conductor layer, and when the content is 5 parts by mass or less, the insulation reliability between the wirings may be prevented from being insufficient.

The thermosetting resin composition of the present invention may contain, in addition to the aforementioned components, a curing agent, a curing accelerator, a thermoplastic resin, an elastomer, an organic filler, a flame retardant, an ultraviolet ray absorbent, an antioxidant, a photopolymerization initiator, a fluorescent whitening agent, an adhesion enhancer and the like in such a range that the advantages of the present invention are not impaired.

Examples of the curing agent include a polyfunctional phenol compound, such as phenol novolak, cresol novolak and aminotriazine novolak resin, an amine compound, such as benzoguanamine, dicyandiamide, diaminodiphenylmethane and diaminodiphenyl sulfone, and an acid anhydride, such as phthalic anhydride, pyromellitic anhydride, maleic anhydride and a maleic anhydride copolymer, which may be used solely or as a mixture of two or more kinds thereof.

Examples of the curing accelerator include an organic metal salt, such as zinc naphthenate, cobalt naphthenate, tin octylate, cobalt octylate, bisacetylacetonatocobalt(II) and trisacetylacetonatocobalt(III), an imidazole compound other than the modified imidazole (C), and a derivative thereof, an organic phosphorus compound, a secondary amine compound, a tertiary amine compound and a quaternary ammonium salt, which may be used solely or as a mixture of two or more kinds thereof.

Examples of the thermoplastic resin include polyethylene, polypropylene, polystyrene, a polyphenylene ether resin, a phenoxy resin, a polycarbonate resin, a polyester resin, a polyamide resin, a polyamideimide resin, a polyimide resin, a xylene resin, a polyphenylene sulfide resin, a polyetherimide resin, a polyether ether ketone resin, a polyetherimide resin, a silicone resin and a tetrafluoroethylene resin.

Examples of the elastomer include polybutadiene, acrylonitrile, epoxy-modified polybutadiene, maleic anhydride-modified polybutadiene, phenol-modified polybutadiene and carboxyl-modified acrylonitrile.

Examples of the organic filler include a resin filler having a homogeneous structure containing polyethylene, polypropylene, polystyrene, a polyphenylene ether resin, a silicone resin, a tetrafluoroethylene resin or the like, and a resin filler having a core-shell structure having a core layer in a rubber state containing an acrylate ester resin, a methacrylate ester resin, a conjugated diene resin or the like, and a shell layer in a glassy state containing an acrylate ester resin, a methacrylate ester resin, an aromatic vinyl resin, a vinyl cyanide resin or the like.

Examples of the flame retardant include a halogen-containing flame retardant containing bromine, chlorine or the like, a nitrogen flame retardant, such as guanidinesulfamate, melaminesulfate, melaminepolyphosphate and melamine cyanurate, a phosphazene flame retardant, such as cyclophosphazene and polyphosphazene, and an inorganic flame retardant, such as antimony trioxide.

Examples of the ultraviolet ray absorbent include a benzotriazole ultraviolet ray absorbent. Examples of the antioxidant include a hindered phenol or hindered amine antioxidant. Examples of the photopolymerization initiator include benzophenone series, benzylketal series and thioxanthone series photopolymerization initiators. Examples of the fluorescent whitening agent include a stilbene derivative fluorescent whitening agent. Examples of the adhesion enhancer include a urea compound, such as urea silane, and a coupling agent, such as a silane series, a titanate series and an aluminate series.

The thermosetting resin composition of the present invention is preferably in the form of a varnish having the components thereof dissolved or dispersed in an organic solvent since the resin composition may be used in a prepreg.

Examples of the organic solvent used herein include an alcohol solvent, such as methanol, ethanol, propanol, butanol, methyl cellosolve, butyl cellosolve and propylene glycol monomethyl ether, a ketone solvent, such as acetone, methyl ethyl ketone, methyl isobutyl ketone and cyclohexanone, an ester solvent, such as butyl acetate and propylene glycol monomethyl ether acetate, an ether solvent, such as tetrahydrofuran, an aromatic solvent, such as toluene, xylene and mesitylene, a nitrogen atom-containing solvent, such as dimethylformamide, dimethylacetamide and N-methylpyrrolidone, and a sulfur atom-containing solvent, such as dimethylsulfoxide, which may be used solely or as a mixture of two or more kinds thereof.

Among these, methyl ethyl ketone, methyl isobutyl ketone, cyclohexanone, methyl cellosolve and propylene glycol monomethyl ether are preferred from the standpoint of the solubility, and methyl isobutyl ketone, cyclohexanone and propylene glycol monomethyl ether are more preferred from the standpoint of the low toxicity.

Upon mixing, the inorganic filler is preferably subjected to a pre-treatment or an integral blend treatment with a surface treating agent, such as a coupling agent, e.g., a silane series and a titanate series, and a silicone oligomer.

The content of the resin composition in the varnish finally obtained is preferably from 40 to 90% by mass, and more preferably from 50 to 80% by mass, based on the total varnish. When the content of the resin composition in the varnish is from 40 to 90% by mass, the coating suitability may be maintained favorably, and a prepreg having a suitable resin composition attached amount may be obtained.

The insulating film with a support of the present invention contains a support having formed on a surface thereof a film containing the thermosetting resin composition in a semi-cured state. The resin composition containing the components (A), (B) and (C), and optionally containing the components (D) to (H) may be coated on the support, dried to evaporate the solvent in the varnish, and semi-cured (rendered into a B-stage), thereby forming the resin composition layer. The semi-cured state is preferably in such a state that the adhesion force between the insulating resin layer and a circuit pattern substrate, on which the insulating resin layer is to be formed, is ensured, and the burying property (i.e., the fluidity) of the circuit pattern substrate is ensured, upon curing the resin composition. Examples of the coating method (coating machine) include a die coater, a comma coater, a bar coater, a kiss coater and a roll coater, which may be appropriately selected depending on the thickness of the insulating resin layer. Examples of the drying method include heating and blowing hot air.

The drying conditions after coating the resin composition on the support are not particularly limited, and the resin composition layer may be dried to a content of the organic solvent in the resin composition layer of 10% by mass or less, and preferably 5% by mass or less. The varnish containing the organic solvent in an amount of from 30 to 60% by mass may be dried at from 50 to 150° C. for approximately from to 10 minutes, thereby forming the insulating resin composition layer, while depending on the content of the organic solvent in the varnish and the boiling point of the organic solvent. The drying conditions are preferably determined through simple experimentations in advance.

The thickness of the insulating resin composition layer formed in the insulating film with a support is generally a thickness that is equal to or larger than the thickness of the conductor layer of the circuit board. The thickness of the conductor layer is preferably from 5 to 70 µm, and for reducing the thickness and the weight of the printed wiring board, the thickness is more preferably from 5 to 50 and most preferably from 5 to 30 µm.

Examples of the support in the insulating film with a support include films containing a polyolefin, such as polyethylene, polypropylene and polyvinyl chloride, a polyester, such as polyethylene terephthalate (which may be hereinafter abbreviated as PET) and polyethylene naphthalate, polycarbonate, and polyimide, releasing paper, and a metal foil, such as a copper foil and an aluminum foil. The support and a protective film described later may be subjected to a matting treatment, a corona treatment and the like, and may also be subjected to a releasing treatment.

The thickness of the support is not particularly limited and is preferably from 10 to 150 µm, and more preferably from 25 to 50 µm. On the surface of the insulating resin composition layer, to which the support is not attached, a protective layer equivalent to the support may be further laminated. The thickness of the protective film is not particularly limited and may be, for example, from 1 to 40 µm. The protective film laminated may prevent foreign matters from being mixed therein.

The insulating film with a support may be stored after winding in the form of a roll.

As an embodiment of the method of producing a printed wiring board by forming a laminate plate with the insulating film with a support of the present invention, for example, the insulating film with a support may be laminated on one surface or both surfaces of a circuit board with a vacuum laminator. Examples of the substrate used in the circuit board include a glass-epoxy substrate, a metal substrate, a polyester substrate, a polyimide substrate, a BT resin substrate and a thermosetting polyphenylene ether substrate. The circuit board referred herein contains the aforementioned substrate having a patterned conductor layer (circuit) formed on one surface or both surfaces thereof. The circuit board herein also includes a laminate plate containing conductor layers and insulating layers laminated alternately and a multilayer printed wiring board produced with the laminate plate, in which a patterned conductor layer (circuit) is formed on one surface or both surfaces of the outermost layers of the printed wiring board. The surface of the conductor layer may be subjected to a roughening treatment, such as black oxide plating, in advance.

In the aforementioned laminate, after removing the protective film when the insulating film with a support has the protective film, the insulating film with a support and the circuit board are pre-heated depending on necessity, and the insulating film with a support is press-adhered to the circuit board while applying pressure and heat to the insulating film with a support. A method of laminating to the circuit board under reduced pressure by a vacuum lamination method is preferably applied to the insulating film with a support of the present invention. The lamination conditions are not particularly limited, and for example, the press-adhering temperature (lamination temperature) is preferably from 70 to 140° C., the press-adhering pressure of from 0.1 to 1.1 MPa, and the lamination is preferably performed under reduced pressure of an air pressure of 20 mmHg (26.7 hPa) or less. The lamination method may be a batch method or a continuous method with a roll.

After laminating the insulating film with a support to the circuit board, the assembly may be cooled to around room temperature, and after removing the support depending on necessity, cured under heating, thereby forming the insulating resin layer on the circuit board. The conditions for the heat curing may be appropriately selected depending on the kinds and contents of the resin components in the resin composition, and are preferably selected from ranges of from 150 to 220° C. and from 20 to 180 minutes, and more preferably ranges of from 160 to 200° C. and from 30 to 120 minutes.

After forming the insulating resin layer, the support is removed when the support has not been removed before curing. A via hole and a through hole are then formed depending on necessity by forming holes in the insulating layer formed on the circuit board. The formation of holes may be performed by a known method, such as drilling, laser or plasma, or by a combination of these methods, and the formation of holes with laser, such as carbon dioxide gas laser or YAG laser, is the most ordinary method.

Subsequently, the conductor layer is formed on the insulating resin layer by dry plating or wet plating. Examples of the dry plating include known methods, such as vapor deposition, sputtering and ion plating. In the case of the wet plating, the surface of the insulating resin composition layer thus cured is roughened with an oxidizing agent, such as a permanganate salt (such as potassium permanganate and sodium permanganate), a bichromate salt, ozone, hydrogen peroxide-sulfuric acid, and nitric acid, thereby forming roughness as anchors. The oxidizing agent is particularly preferably a sodium hydroxide aqueous solution containing potassium permanganate, sodium permanganate or the like (i.e., an alkaline permanganic acid aqueous solution). The conductor layer is then formed by a method combining electroless plating and electrolytic plating. In alternative, a plating resist having a reverse pattern to the conductor layer may be formed, and the conductor layer may be formed only by electroless plating. Examples of the subsequent pattern formation method include a known method, such as a subtractive method and a semi-additive method.

The prepreg of the present invention contains the thermosetting resin composition that is coated on a reinforcing substrate in the form of a fiber sheet and is rendered into a B-stage. The prepreg of the present invention will be described in detail below.

The prepreg of the present invention may be produced in such a manner that the thermosetting resin composition is coated on the reinforcing substrate in the form of a fiber sheet by a method, such as impregnation, spraying or extrusion, and rendered into a semi-cured state (B-stage).

The reinforcing substrate in the form of a fiber sheet of the prepreg may be any known one that has been used in various kinds of laminate plates for an electric insulating material. Examples of the material therefor include inorganic fibers of E-glass, D-glass, S-glass, Q-glass or the like, organic fibers of polyimide, polyester, tetrafluoroethylene or the like, and mixtures thereof. While the substrate may have, for example, in the form of a woven cloth, a nonwoven cloth, a roving cloth, a chopped strand mat, a surfacing mat or the like, the material and the form thereof may be selected depending on the purpose and the performance of the target molded article, and the materials and the forms thereof may be employed solely or combinations of two or more kinds thereof.

The thickness of the reinforcing substrate in the form of a fiber sheet is not particularly limited and may be, for example, approximately from 0.03 to 0.5 mm, and the substrate, which have been subjected to a surface treatment with a silane coupling agent or the like or subjected to a mechanical filamentization treatment, is preferred from the standpoint of the heat resistance, the moisture resistance and the processability. The substrate may be impregnated or coated with the resin composition to an attached amount of the resin composition to the substrate of from 20 to 90% by mass in terms of the resin content of the prepreg after drying, and then the resin composition is dried at a temperature of from 100 to 200° C. for from 1 to 30 minutes for being rendered into a B-stage, thereby providing the prepreg of the present invention.

Preferred examples of the method of impregnating the reinforcing substrate in the form of a fiber sheet with the thermosetting resin composition include a hot-melt method and a solvent method described below.

The hot-melt method is such a method that the resin is once coated on coated paper with good releasability to the resin without dissolving the resin in an organic solvent, and then laminated to the reinforcing substrate in the form of a sheet, or in alternative, the resin is coated directly to the reinforcing substrate in the form of a sheet with a die coater without dissolving the resin in an organic solvent, thereby producing the prepreg.

The solvent method is such a method that the resin varnish is prepared by dissolving the resin in an organic solvent as similar to the insulating film with a support, and the reinforcing substrate in the form of a sheet is impregnated with the resin varnish by immersing the reinforcing substrate in the form of a sheet in the varnish, followed by drying.

The laminate plate of the present invention is a laminate plate that is formed by using at least one sheet of the aforementioned insulating film with a support, the aforementioned prepreg, or both of them. For example, the laminate plate may be produced by laminating and molding 1 to 20 sheets of the prepregs laminated on each other with a metal foil, such as copper or aluminum, disposed on one surface or both surfaces thereof. The metal foil is not particularly limited as far as it is used for the purpose of electric insulating material.

The molding conditions may be those for a laminate plate for an electric insulating material and a multilayer plate, and for example, the molding may be performed with multi-platen press, multiplaten vacuum press, continuous molding, autoclave molding or the like, at a temperature of from 100 to 250° C. and a pressure of from 2 to 100 kg/cm² for a heating time of from 0.1 to 5 hours.

Furthermore, a multilayer plate may be produced by laminating and molding a combination of the prepreg of the present invention and a wiring plate for an inner layer.

The printed wiring board of the present invention is produced by using the aforementioned laminate plate, and may be produced by forming a circuit on the surface of the laminate plate.

Specifically, the conductor layer of the laminate plate of the present invention is processed into wiring by an ordinary etching method, and plural laminate plates having wiring are laminated through the prepreg. The laminated assembly is pressed under heating to form a multilayer structure. Thereafter, a through hole and a blind via hole are formed by drilling or laser, and an interlayer connection is formed with plating or an electroconductive paste, thereby producing the printed wiring board.

EXAMPLE

The present invention will be described in more detail with reference to the following examples, but the present invention is not limited to the description thereof.

The varnishes and the copper-clad laminate plates obtained in Examples and Comparative Examples were measured for the performance and evaluated in the following manners.

Varnish (1) Curing Property (Time to Gelation)

A 0.5 mL portion as a specimen of each of the varnishes obtained in Examples and Comparative Examples was measured for the time from the input of the specimen to gelation ($T_0$) of the specimen by using a gel timer, produced by Nisshin Kagaku Co., Ltd., set at 160° C.

(2) Storage Stability

The varnishes obtained in Examples and Comparative Examples were each stored at 40° C. for 3 days, and then measured for the time to gelation ($T_1$) in the same manner as in the measurement of the curing property. The storage stability rate was obtained according to the following equation.

storage stability rate=$T_1/T_0 \times 100(\%)$

Copper-Clad Laminate Plate (1) Heat Resistance (Glass Transition Temperature Tg (° C.))

The copper-clad laminate plates obtained in Examples and Comparative Examples were each immersed in a copper etching solution, thereby removing the copper foil, and a substrate for evaluation having a size of 5 mm square was prepared. The substrate for evaluation was measured for Tg by observing the thermal expansion characteristics in the z direction thereof with TMA tester (TMA2940, produced by DuPont Company), thereby evaluating the heat resistance.

(2) Thermal Expansion Coefficient (Ppm/° C.)

The copper-clad laminate plates obtained in Examples and Comparative Examples were each immersed in a copper etching solution, thereby removing the copper foil, and a substrate for evaluation having a size of 5 mm square was prepared. The substrate for evaluation was observed for the thermal expansion characteristics in the z direction thereof at a temperature lower than Tg with TMA tester (TMA2940, produced by DuPont Company), thereby evaluating the thermal expansion coefficient.

(3) Copper Foil Adhesiveness (Copper Foil Peeling Strength (kN/m))

The copper foil of each of the copper-clad laminate plates obtained in Examples and Comparative Examples was partially covered with a resist and immersed in a copper etching solution, thereby preparing a substrate for evaluation having the copper foil remaining with a width of 3 mm. The substrate for evaluation was measured for the adhesiveness (peeling strength) of the copper foil with a tensile tester.

(4) Hygroscopicity (Water Absorption Coefficient (%))

The copper-clad laminate plates obtained in Examples and Comparative Examples were each immersed in a copper etching solution, thereby removing the copper foil, and thereby a substrate for evaluation was prepared. The substrate for evaluation was subjected to a pressure cooker treatment under conditions of 121° C. and 2 atm for 5 hours with a pressure cooker tester, produced by Hirayama Manufacturing Corporation, and then the substrate for evaluation was measured for the water absorption coefficient.

(5) Chemical Resistance (Rate of Change of Mass (% by Mass))

The copper-clad laminate plates obtained in Examples and Comparative Examples were each immersed in a copper etching solution, thereby removing the copper foil, and thereby a substrate for evaluation was prepared. The substrate for evaluation was immersed in 18% by mass hydrochloric acid or a 10% by mass NaOH aqueous solution at 40° C. for 30 minutes, and then calculated for the rate of change of mass (((reduction of mass (g))/(mass of test piece before treatment (g)))×100).

Example A

Production Example 1

Production of Solution of Resin Composition Having Unsaturated Maleimide Group (A-1)

569.30 g of bis(4-maleimidophenyl)methane, 59.04 g of 4,4'-diaminodiphenylmethane and 350.00 g of propylene glycol monomethyl ether were placed in a reaction vessel having a capacity of 2 L capable of being heated and cooled, equipped with a thermometer, an agitator and a water quantity meter having a reflux condenser, and were reacted for 5 hours under refluxing, thereby providing a solution of a resin composition having an unsaturated maleimide group (A-1).

Production Example 2

Production of Solution of Resin Composition Having Unsaturated Maleimide Group (A-2)

555.04 g of bis(4-maleimidophenyl)methane, 73.84 g of 3,3'-diethyl-4,4'-diaminodiphenylmethane and 350.00 g of propylene glycol monomethyl ether were placed in a reaction vessel having a capacity of 2 L capable of being heated and cooled, equipped with a thermometer, an agitator and a water quantity meter having a reflux condenser, and were reacted for 5 hours under refluxing, thereby providing a solution of a resin composition having an unsaturated maleimide group (A-2).

Production Example 3

Production of Solution of Resin Composition Having Unsaturated Maleimide Group (A-3)

556.53 g of bis(4-maleimidophenyl)methane, 72.29 g of 3,3'-diaminodiphenyl sulfone and 350.00 g of dimethylacetamide were placed in a reaction vessel having a capacity of 2 L capable of being heated and cooled, equipped with a thermometer, an agitator and a water quantity meter having a reflux condenser, and were reacted at 100° C. for 5 hours, thereby providing a solution of a resin composition having an unsaturated maleimide group (A-3).

Production Example 4

Production of Solution of Resin Composition Having Unsaturated Maleimide Group (A-4)

562.69 g of polyphenylmethanemaleimide, 66.03 g of 3,3'-dimethyl-4,4'-diaminodiphenylmethane and 350.00 g of propylene glycol monomethyl ether were placed in a reaction vessel having a capacity of 2 L capable of being heated and cooled, equipped with a thermometer, an agitator and a water quantity meter having a reflux condenser, and were reacted for 5 hours under refluxing, thereby providing a solution of a resin composition having an unsaturated maleimide group (A-4).

Production Example 5

Production of Powder of Resin Composition Having Unsaturated Maleimide Group (A-5)

358.00 g of bis(4-maleimidophenyl)methane and 54.50 g of 4,4'-diaminodiphenylmethane were placed in a kneader having a capacity of 1 L, equipped with a steam heating device, kneaded under heat at from 135 to 140° C. for 15 minutes, then cooled and pulverized, thereby providing powder of a resin composition having an unsaturated maleimide group (A-5).

Production Example 6

Production of Powder of Resin Composition Having Unsaturated Maleimide Group (A-6)

358.00 g of polyphenylmethanemaleimide and 68.50 g of 3,3'-dimethyl-4,4'-diaminodiphenylmethane were placed in a kneader having a capacity of 1 L, equipped with a steam heating device, kneaded under heat at from 135 to 140° C. for 15 minutes, then cooled and pulverized, thereby providing powder of a resin composition having an unsaturated maleimide group (A-6).

Production Example 7

Production of Solution of Resin Composition Having Unsaturated Maleimide Group (A-7)

38.60 g of 4,4'-bis(4-aminophenoxy) biphenyl, 478.50 g of 2,2'-bis[4-(4-maleimidophenoxy)phenyl]propane, 22.90 g of p-aminophenol and 360.00 g of propylene glycol monomethyl ether were placed in a reaction vessel having a capacity of 2 L capable of being heated and cooled, equipped with a thermometer, an agitator and a water quantity meter having a reflux condenser, and were reacted at the refluxing temperature for 2 hours, thereby providing a solution of a resin composition having an acidic substituent and an unsaturated maleimide group (A-7).

Production Example 8

Production of Solution of Resin Composition Having Unsaturated Maleimide Group (A-8)

69.10 g of 4,4'-bis(4-aminophenoxy) biphenyl, 429.90 g of bis(4-maleimidophenyl) sulfone, 41.00 g of p-aminophenol and 360.00 g of propylene glycol monomethyl ether were placed in a reaction vessel having a capacity of 2 L capable of being heated and cooled, equipped with a thermometer, an agitator and a water quantity meter having a reflux condenser, and were reacted at the refluxing temperature for 2 hours, thereby providing a solution of a resin composition having an acidic substituent and an unsaturated maleimide group (A-8).

Production Example 9

Production of Solution of Resin Composition Having Unsaturated Maleimide Group (A-9)

32.20 g of 2,2'-dimethyl-4,4'-diaminobiphenyl, 475.20 g of 3,3-dimethyl-5,5-diethyl-4,4-diphenylmethanebismaleimide, 32.60 g of p-aminophenol and 360.00 g of dimethylacetamide were placed in a reaction vessel having a capacity of 2 L capable of being heated and cooled, equipped with a thermometer, an agitator and a water quantity meter having a reflux condenser, and were reacted at 100° C. for 2 hours, thereby providing a solution of a resin composition having an acidic substituent and an unsaturated maleimide group (A-9).

Production Example 10

Production of Solution of Resin Composition Having Unsaturated Maleimide Group (A-10)

36.70 g of o-dianisidine, 471.10 g of 3,3-dimethyl-5,5-diethyl-4,4-diphenylmethanebismaleimide, 32.20 g of p-aminophenol and 360.00 g of dimethylacetamide were placed in a reaction vessel having a capacity of 2 L capable of being heated and cooled, equipped with a thermometer, an agitator and a water quantity meter having a reflux condenser, and were reacted at 100° C. for 2 hours, thereby providing a solution of a resin composition having an acidic substituent and an unsaturated maleimide group (A-10).

Production Example 11

Production of Solution of Resin Composition Having Unsaturated Maleimide Group (A-11)

40.20 g of bis(4-aminophenyl) sulfone, 464.40 g of bis(4-maleimidophenyl)methane, 35.40 g of p-aminophenol and 360.00 g of dimethylacetamide were placed in a reaction vessel having a capacity of 2 L capable of being heated and cooled, equipped with a thermometer, an agitator and a water quantity meter having a reflux condenser, and were reacted at 100° C. for 4 hours, thereby providing a solution of a resin composition having an acidic substituent and an unsaturated maleimide group (A-11).

Production Example 12

Production of Solution of Resin Composition Having Unsaturated Maleimide Group (A-12)

44.80 g of bis[4-(4-aminophenoxy)phenyl]sulfone, 472.60 g of 2,2-bis(4-(4-maleimidophenoxy)phenyl) propane, 22.60 g of p-aminophenol and 360.00 g of propylene glycol monomethyl ether were placed in a reaction vessel having a capacity of 2 L capable of being heated and cooled, equipped with a thermometer, an agitator and a water quantity meter having a reflux condenser, and were reacted at the reflux temperature for 2 hours, thereby providing a solution of a resin composition having an acidic substituent and an unsaturated maleimide group (A-12).

Production Example 13

Production of Solution of Resin Composition Having Unsaturated Maleimide Group (A-13)

79.40 g of bis[4-(4-aminophenoxyl)phenyl]sulfone, 420.50 g of bis(4-maleimidophenyl) sulfone, 40.10 g of p-aminophenol and 360.00 g of propylene glycol monomethyl ether were placed in a reaction vessel having a capacity of 2 L capable of being heated and cooled, equipped with a thermometer, an agitator and a water quantity meter having a reflux condenser, and were reacted at the reflux temperature for 2 hours, thereby providing a solution of a resin composition having an acidic substituent and an unsaturated maleimide group (A-13).

Production Example 14

Production of Solution of Resin Composition Having Unsaturated Maleimide Group (A-14)

44.10 g of o-tolidine sulfone, 460.80 g of bis(4-maleimidophenyl)methane, 35.10 g of p-aminophenol and 360.00 g of dimethylacetamide were placed in a reaction vessel having a capacity of 2 L capable of being heated and cooled, equipped with a thermometer, an agitator and a water quantity meter having a reflux condenser, and were reacted at 100° C. for 2 hours, thereby providing a solution of a resin composition having an acidic substituent and an unsaturated maleimide group (A-14).

Production Example 15

Production of Solution of Resin Composition Having Unsaturated Maleimide Group (A-15)

358.00 g of bis(4-maleimidophenyl)methane, 54.50 g of p-aminophenol and 412.50 g of propylene glycol monomethyl ether were placed in a reaction vessel having a capacity of 2 L capable of being heated and cooled, equipped with a thermometer, an agitator and a water quantity meter having a reflux condenser, and were reacted for 5 hours under refluxing, thereby providing a solution of a resin composition having an acidic substituent and an unsaturated maleimide group (A-15).

Production Example 16

Production of Solution of Resin Composition Having Unsaturated Maleimide Group (A-16)

358.0 g of polyphenylmethanemaleimide, 54.50 g of p-aminophenol and 412.50 g of propylene glycol monomethyl ether were placed in a reaction vessel having a capacity of 2 L capable of being heated and cooled, equipped with a thermometer, an agitator and a water quantity meter having a reflux condenser, and were reacted for 5 hours under refluxing, thereby providing a solution of a resin composition having an acidic substituent and an unsaturated maleimide group (A-16).

Production Example 17

Production of Solution of Resin Composition Having Unsaturated Maleimide Group (A-17)

360.00 g of bis(4-maleimidophenyl) ether, 54.50 g of p-aminophenol and 414.50 g of dimethylacetamide were placed in a reaction vessel having a capacity of 2 L capable of being heated and cooled, equipped with a thermometer, an agitator and a water quantity meter having a reflux condenser, and were reacted at 100° C. for 2 hours, thereby providing a solution of a resin composition having an acidic substituent and an unsaturated maleimide group (A-17).

Examples 1 to 31 and Comparative Examples 1 to 6

Uniform varnishes having a resin content (i.e., a total amount of the resin components) of 65% by mass were produced by mixing the following ingredients according to the mixing ratios (by mass) shown in Tables 1 to 6:

(1) as the curing agent, the solutions of the resin composition having an unsaturated maleimide group (A) obtained in Production Examples 1 to 17, (2) as the thermosetting resin (B), a novolak type cyanate resin (PT-30, a trade name, produced by Lonza Japan, Ltd.), a bisphenol A dicyanate prepolymer (BA230, a trade name, produced by Lonza Japan, Ltd.), a tetrafunctional naphthalene type epoxy resin (EXA-4710, a trade name, produced by Dainippon Ink And Chemicals, Inc.), a biphenyl aralkyl type epoxy resin (NC-3000-H, a trade name, produced by Nippon Kayaku Co., Ltd.), a bifunctional naphthalene type epoxy resin (HP-4032D, a trade name, produced by Dainippon Ink And Chemicals, Inc.), a naphthol aralkyl type epoxy resin (ESN-175, a trade name, produced by Tohto Kasei Co., Ltd.), a bifunctional naphthalene aralkyl type epoxy resin (ESN-375, a trade name, produced by Tohto Kasei Co., Ltd.), a biphenyl type epoxy resin (YX-4000, a trade name, produced by Japan Epoxy Resin Co., Ltd.), and an anthracene type epoxy resin (YX-8800, a trade name, produced by Japan Epoxy Resin Co., Ltd.), (3) as the modified imidazole (C), an isocyanate-masked imidazole (G8009L, a trade name, produced by Dai-ichi Kogyo Seiyaku Co., Ltd.) and an epoxy-masked imidazole (P200H50, a trade name, produced by Japan Epoxy Resin Co., Ltd.), (4) as the amine compound having an acidic substituent (D), p-aminophenol (produced by Ihara Chemical Industry Co., Ltd.), (5) as the inorganic filler (E), fused silica (SC2050-KC, a trade name, produced by Admatechs Co., Ltd.), aluminum hydroxide (HP-360, a trade name, produced by Showa Denko K.K.), and boehmite (BMT-3LV, a trade name, produced by Kawai Lime Industry Co., Ltd.), (6) as the molybdenum compound (F), zinc molybdate (KEMGARD 1100, a trade name, produced by Sherwin-Williams Company), (7) as the phosphorus-containing compound that imparts flame retardancy (G), a phosphorus-containing epoxy resin (Epotohto ZX-1548-3, a trade name, produced by Tohto Kasei Co., Ltd., phosphorus content: 3% by mass), a phosphorus-containing phenol resin (HCA-HQ, a trade name, produced by Sanko Co., Ltd., phosphorus content: 9.6% by mass), a condensation type phosphate ester compound (PX-200, a trade name, produced by Daihachi Chemical Industry Co., Ltd.), and aluminum dialkylphosphinate (OP-930, a trade name, produced by Clariant Japan Co., Ltd.), (8) as the compound that achieves chemical roughening (H), crosslinked acrylonitrile-butadiene rubber (NBR) particles (XER-91, produced by JSR Corporation), core-shell type rubber particles (Stafiloid AC3832, a trade name, produced by Ganz Chemical Co., Ltd.), a polyvinyl acetal resin (KS-23Z, a trade name, produced by Sekisui Chemical Co., Ltd.), (9) as the epoxy resin curing agent (I), an aminotriazine novolak resin (LA-3018, a trade name, produced by Dainippon Ink And Chemicals, Inc.), benzoguanamine (produced by Nippon Shokubai Co., Ltd.), and dicyandiamide (produced by Daieikagaku Co., Ltd.), and

(10) as the diluent solvent, methyl ethyl ketone.

In Comparative Examples, 2-phenylimidazole (2PZ, a trade name, produced by Shikoku Chemicals Corporation) and 2-ethyl-4-methylimidazole (2E4MZ, a trade name, produced by Shikoku Chemicals Corporation), which were each a curing accelerator (i.e., a non-modified imidazole), were used instead of the modified imidazole (C).

The isocyanate-masked imidazole (G8009L) is the modified imidazole represented by the general formula (I), wherein $R_3$ and $R_5$ are each $CH_3$, $R_4$ and $R_6$ are each $C_2H_5$, and A is $CH_4$, and the epoxy-masked imidazole (P200H50) is the modified imidazole represented by the general formula (II), wherein $R_3$ and $R_5$ are each hydrogen, $R_4$ and $R_6$ are each a phenyl group, and B is $C(CH_3)_2$.

The varnishes thus produced were evaluated for the curing property (i.e., the time to gelation) and the storage stability of the varnishes according to the methods described above.

The varnishes were each coated by impregnation on an E-glass cloth having a thickness of 0.1 mm and dried under heat at 160° C. for 10 minutes, thereby providing a prepreg having a resin content of 50% by mass. Four sheets of the prepreg were laminated with electrolytic copper foils having a thickness of 18 μm disposed on both surfaces thereof, and the assembly was pressed at a pressure of 2.5 MPa and a temperature of 185° C. for 90 minutes, thereby producing a copper-clad laminate plate.

The resulting copper-clad laminate plates were measured and evaluated for the heat resistance (i.e., the glass transition temperature), the thermal expansion coefficient, the copper foil adhesiveness, the hygroscopicity and the chemical resistance. The results are shown in Tables 1 to 6.

TABLE 1

|  | Example 1 | Example 2 | Example 3 | Example 4 | Example 5 | Example 6 |
|---|---|---|---|---|---|---|
| Thermosetting Resin Composition (part by mass) | | | | | | |
| (A) Resin composition having unsaturated maleimide group | | | | | | |
| A-1 | 50 | | | | | 49 |
| A-2 | | 50 | 50 | | | |
| A-3 | | | | 50 | | |
| A-4 | | | | | 49 | |
| (B) Thermosetting resin | | | | | | |
| Novolak type cyanate resin (PT-30) | 49.5 | | | | | 49.5 |
| Bisphenol A type dicyanate prepolymer (BA230) | | 49.5 | | | | |
| Tetrafunctional naphthalene type epoxy resin (EXA-4710) | | | 49.5 | | | |
| Biphenyl aralkyl type epoxy resin (NC-3000-H) | | | | 49.5 | 49.5 | |
| (C) Modified imidazole | | | | | | |
| Isocyanate-masked imidazole (G8009L) | 0.5 | 0.5 | | | 0.5 | 0.5 |
| Epoxy-masked imidazole (P200H50) | | | 0.5 | 0.5 | | |
| (D) Amine compound having acidic substituent | | | | | | |
| p-Aminophenol | | | | | 1 | 1 |
| (E) Inorganic filler | | | | | | |
| Fused silica (SC2050-KC) | | | | | | 50 |
| Aluminum hydroxide (HP-360) | | | | | | |
| Boehmite (BMT-3LV) | | | | | | |
| (F) Molybdenum compound | | | | | | |
| Zinc molybdate (KEMGARD 1100) | | | 10 | | | |
| Results of Measurement and Evaluation | | | | | | |
| Varnish | | | | | | |
| (1) Curing property (time to gelation $T_0$, sec) | 420 | 450 | 500 | 470 | 400 | 450 |
| (2) Storage stability (after storing at 40° C. for 3 days $T_1$, sec) | 415 | 446 | 498 | 466 | 398 | 445 |
| Storage stability (%) = $T_1/T_0$ | 98.8 | 99.1 | 99.6 | 99.1 | 99.5 | 98.9 |
| Copper-clad laminate plate | | | | | | |
| (1) Heat resistance (glass transition temperature, ° C.) | 220 | 210 | 220 | 220 | 220 | 210 |
| (2) Thermal expansion coefficient (ppm/° C.) | 50 | 50 | 50 | 50 | 50 | 28 |

TABLE 1-continued

|  | Example 1 | Example 2 | Example 3 | Example 4 | Example 5 | Example 6 |
|---|---|---|---|---|---|---|
| (3) Copper foil adhesiveness (kN/m) | 1.3 | 1.2 | 1.3 | 1.3 | 1.2 | 1.2 |
| (4) Hygroscopicity (water absorption coefficient, %) | 0.6 | 0.6 | 0.6 | 0.6 | 0.5 | 0.5 |
| (5) Chemical resistance (rate of change of mass, % by mass) |  |  |  |  |  |  |
| 18% by mass hydrochloric acid | −0.006 | −0.006 | −0.006 | −0.006 | −0.006 | −0.007 |
| 10% by mass NaOH aqueous solution | −0.006 | −0.008 | −0.008 | −0.008 | −0.008 | −0.009 |

TABLE 2

|  | Example 7 | Example 8 | Example 9 | Example 10 | Example 11 | Example 12 |
|---|---|---|---|---|---|---|
| Thermosetting Resin Composition (part by mass) |  |  |  |  |  |  |
| (A) Resin composition having unsaturated maleimide group |  |  |  |  |  |  |
| A-2 | 49 |  |  | 48 |  |  |
| A-3 |  | 49 | 49 |  |  |  |
| A-4 |  |  |  |  | 49 |  |
| A-5 |  |  |  |  |  | 49 |
| (B) Thermosetting resin |  |  |  |  |  |  |
| Novolak type cyanate resin (PT-30) |  |  |  |  |  |  |
| Bisphenol A type dicyanate prepolymer (BA230) |  | 20 |  |  |  |  |
| Tetrafunctional naphthalene type epoxy resin (EXA-4710) | 49.5 | 29.5 | 20 |  | 49 |  |
| Biphenyl aralkyl type epoxy resin (NC-3000-H) |  |  | 29.5 | 49.5 |  | 49 |
| (C) Modified imidazole |  |  |  |  |  |  |
| Isocyanate-masked imidazole (G8009L) | 0.5 | 0.5 | 0.5 | 0.5 | 1.0 | 1.0 |
| Epoxy-masked imidazole (P200H50) |  |  |  |  |  |  |
| (D) Amine compound having acidic substituent |  |  |  |  |  |  |
| p-Aminophenol | 1 | 1 | 1 | 2 | 1 | 1 |
| (E) Inorganic filler |  |  |  |  |  |  |
| Fused silica (SC2050-KC) | 50 | 50 | 50 | 50 | 50 | 50 |
| Aluminum hydroxide (HP-360) | 50 | 50 |  |  |  |  |
| Boehmite (BMT-3LV) |  |  | 50 | 50 | 50 | 50 |
| (F) Molybdenum compound |  |  |  |  |  |  |
| Zinc molybdate (KEMGARD 1100) |  | 10 | 10 | 10 | 10 | 10 |
| Results of Measurement and Evaluation |  |  |  |  |  |  |
| Varnish |  |  |  |  |  |  |
| (1) Curing property (time to gelation $T_0$, sec) | 450 | 450 | 440 | 440 | 400 | 400 |
| (2) Storage stability (after storing at 40° C. for 3 days $T_1$, sec) | 447 | 447 | 436 | 435 | 396 | 396 |
| Storage stability (%) = $T_1/T_0$ | 99.3 | 99.3 | 99.1 | 98.9 | 99.0 | 99.0 |
| Copper-clad laminate plate |  |  |  |  |  |  |
| (1) Heat resistance (glass transition temperature, ° C.) | 210 | 230 | 230 | 220 | 220 | 230 |
| (2) Thermal expansion coefficient (ppm/° C.) | 24 | 23 | 21 | 23 | 22 | 22 |
| (3) Copper foil adhesiveness (kN/m) | 1.2 | 1.3 | 1.3 | 1.4 | 1.4 | 1.2 |
| (4) Hygroscopicity (water absorption coefficient, %) | 0.5 | 0.5 | 0.5 | 0.5 | 0.5 | 0.5 |
| (5) Chemical resistance (rate of change of mass, % by mass) |  |  |  |  |  |  |
| 18% by mass hydrochloric acid | −0.007 | −0.007 | −0.006 | −0.007 | −0.006 | −0.007 |
| 10% by mass NaOH aqueous solution | −0.008 | −0.008 | −0.008 | −0.009 | −0.007 | −0.008 |

TABLE 3

|  | Comp. Example 1 | Comp. Example 2 | Comp. Example 3 | Comp. Example 4 | Comp. Example 5 | Comp. Example 6 |
|---|---|---|---|---|---|---|
| Thermosetting Resin Composition (part by mass) | | | | | | |
| (A) Resin composition having unsaturated maleimide group | | | | | | |
| A-1 | 50 | 50 | | | | |
| A-2 | | | 49 | 49 | | |
| A-5 | | | | | 50 | |
| A-6 | | | | | | 49 |
| (B) Thermosetting resin | | | | | | |
| Novolak type dicyanate resin (PT-30) | 50 | | | | | |
| Bisphenol A type cyanate prepolymer (BA230) | | | 49.5 | | | |
| Tetrafunctional naphthalene type epoxy resin (EXA-4710) | | 49.5 | | | 49.5 | |
| Biphenyl aralkyl type epoxy resin (NC-3000-H) | | | | 49.5 | | 49 |
| (D) Amine compound having acidic substituent | | | | | | |
| p-Aminophenol | | | 1 | 1 | | 1 |
| (E) Inorganic filler | | | | | | |
| Fused silica (SC2050-KC) | | | 50 | 50 | 50 | 50 |
| Aluminum hydroxide (HP-360) | | | | | 50 | |
| Boehmite (BMT-3LV) | | | | 50 | | 50 |
| (F) Molybdenum compound | | | | | | |
| Zinc molybdate (KEMGARD 1100) | | 10 | 10 | 10 | 10 | 10 |
| Curing accelerator (non-modified imidazole) | | | | | | |
| 2-Phenylimidazole (2PZ) | | 0.5 | | | | 0.5 |
| 2-Ethyl-4-methyl-imidazole (2E4MZ) | | | | 0.5 | 0.5 | 0.5 |
| Results of Measurement and Evaluation | | | | | | |
| Varnish | | | | | | |
| (1) Curing property (time to gelation $T_0$, sec) | 600 | 400 | 550 | 400 | 350 | 350 |
| (2) Storage stability (after storing at 40° C. for 3 days $T_1$, sec) | 550 | 250 | 500 | 220 | 200 | 180 |
| Storage stability (%) = $(T_0 - T_1)/T_0$ | 91.7 | 62.5 | 90.9 | 50.0 | 57.1 | 51.4 |
| Copper-clad laminate plate | | | | | | |
| (1) Heat resistance (glass transition temperature, ° C.) | 180 | 180 | 170 | 180 | 140 | 150 |
| (2) Thermal expansion coefficient (ppm/° C.) | 66 | 59 | 40 | 35 | 40 | 40 |
| (3) Copper foil adhesiveness (kN/m) | 1.0 | 1.2 | 1.2 | 1.1 | 0.8 | 1.0 |
| (4) Hygroscopicity (water absorption coefficient, %) | 0.7 | 0.6 | 0.5 | 0.5 | 0.8 | 0.7 |
| (5) Chemical resistance (rate of change of mass, % by mass) | | | | | | |
| 18% by mass hydrochloric acid | −0.015 | −0.007 | −0.015 | −0.007 | −0.020 | −0.015 |
| 10% by mass NaOH aqueous solution | −0.020 | −0.008 | −0.040 | −0.009 | −0.040 | −0.032 |

TABLE 4

|  | Example 13 | Example 14 | Example 15 | Example 16 | Example 17 | Example 18 |
|---|---|---|---|---|---|---|
| Thermosetting Resin Composition (part by mass) | | | | | | |
| (A) Resin composition having unsaturated maleimide group | | | | | | |
| A-7 | 50 | | | | | |
| A-8 | | 50 | 50 | | | |
| A-9 | | | | 50 | 70 | |
| A-10 | | | | | | 50 |
| (B) Thermosetting resin | | | | | | |
| Biphenyl aralkyl type epoxy resin (NC-3000-H) | 30 | | | | | |
| HP-4032D | | 49.5 | | | | |
| HSN-175 | | | 30 | | | |
| EP-806 | | | | | 20 | |
| N-770 | | | | | | 30 |
| YX-8800 | | | | 30 | | |
| (C) Modified imidazole | | | | | | |
| Isocyanate-masked imidazole (G8009L) | 0.5 | 0.5 | 0.5 | 0.5 | 0.5 | 0.5 |
| (E) Inorganic filler | | | | | | |
| Fused silica (SC2050-KC) | 40 | 40 | 40 | 40 | 40 | 40 |
| (G) Phosphorus-containing compound | | | | | | |
| HCA-HQ | 3 | 3 | 3 | 3 | 3 | 3 |
| (H) Compound achieving chemical roughening | | | | | | |
| XER-91 | 1 | 1 | 1 | 1 | 1 | 1 |
| (I) Epoxy curing agent | | | | | | |
| LA-3018 | 15 | | 19.5 | 18.5 | 4.5 | 4.5 |
| Dicyandiamide | | | | 1 | | |
| Benzoguanamine | 4.5 | | | | 5 | 5 |
| Phosphorus atom content | 0.3 | 0.3 | 0.3 | 0.3 | 0.3 | 0.3 |
| Results of Measurement and Evaluation | | | | | | |
| Varnish | | | | | | |
| (1) Curing property (time to gelation $T_0$, sec) | 480 | 530 | 500 | 550 | 580 | 560 |
| (2) Storage stability (after storing at 40° C. for 3 days $T_1$, sec) | 479 | 528 | 497 | 549 | 578 | 559 |
| Storage stability (%) = $T_1/T_0$ | 99.6 | 99.6 | 99.4 | 99.8 | 99.7 | 99.8 |
| Copper-clad laminate plate | | | | | | |
| (1) Heat resistance (glass transition temperature, ° C.) | 240 | 260 | 260 | 260 | 270 | 240 |
| (2) Thermal expansion coefficient (ppm/° C.) | 20 | 26 | 28 | 30 | 31 | 33 |
| (3) Copper foil adhesiveness (kN/m) | 1.3 | 1.3 | 1.3 | 1.3 | 1.2 | 1.3 |
| (4) Hygroscopicity (water absorption coefficient, %) | 0.5 | 0.5 | 0.5 | 0.5 | 0.5 | 0.5 |
| (5) Chemical resistance (rate of change of mass, % by mass) | | | | | | |
| 18% by mass hydrochloric acid | −0.008 | −0.009 | −0.008 | −0.008 | −0.008 | −0.009 |
| 10% by mass NaOH aqueous solution | −0.025 | −0.020 | −0.020 | −0.015 | −0.025 | −0.020 |

TABLE 5

|  | Example 19 | Example 20 | Example 21 | Example 22 | Example 23 | Example 24 |
|---|---|---|---|---|---|---|
| Thermosetting Resin Composition (part by mass) | | | | | | |
| (A) Resin composition having unsaturated maleimide group | | | | | | |
| A-10 | 50 | 70 | | | | |
| A-11 | | | 50 | | | |
| A-12 | | | | 50 | | |
| A-13 | | | | | 50 | |
| A-14 | | | | | | 50 |
| (B) Thermosetting resin | | | | | | |
| HP-4032D | | | | 35 | | |
| HSN-175 | | | | 30 | | |
| HSN-375 | | 20 | | | 30 | |
| YX-4000 | | | | | | 30 |
| YX-8800 | 30 | | | | | |
| (C) Modified imidazole | | | | | | |
| Isocyanate-masked imidazole (G8009L) | 0.5 | 0.5 | 0.5 | 0.5 | 0.5 | 0.5 |
| (E) Inorganic filler | | | | | | |
| Fused silica (SC2050-KC) | 40 | 40 | 40 | 40 | 40 | 40 |
| (G) Phosphorus-containing compound | | | | | | |
| HCA-HQ | 3 | 3 | | 5 | 3 | 3 |
| ZX-1548-3 | | | 10 | | | |
| (H) Compound achieving chemical roughening | | | | | | |
| XER-91 | 1 | 1 | 1 | 1 | 1 | 1 |
| AC3832 | | | 1 | | | |
| (I) Epoxy curing agent | | | | | | |
| LA-3018 | 13.5 | 9.5 | | 19.5 | 19.5 | 15 |
| Dicyandiamide | 1 | | 5 | | | 4.5 |
| Benzoguanamine | 5 | | | | | |
| Phosphorus atom content | 0.3 | 0.3 | 0.3 | 0.5 | 0.3 | 0.3 |
| Results of Measurement and Evaluation | | | | | | |
| Varnish | | | | | | |
| (1) Curing property (time to gelation T$_0$, sec) | 530 | 600 | 530 | 470 | 500 | 480 |
| (2) Storage stability (after storing at 40° C. for 3 days T$_1$, sec) | 528 | 597 | 526 | 468 | 497 | 477 |
| Storage stability (%) = T$_1$/T$_0$ | 99.6 | 99.5 | 99.2 | 99.6 | 99.4 | 99.4 |
| Copper-clad laminate plate | | | | | | |
| (1) Heat resistance (glass transition temperature, ° C.) | 240 | 260 | 260 | 260 | 260 | 240 |
| (2) Thermal expansion coefficient (ppm/° C.) | 32 | 28 | 28 | 26 | 26 | 32 |
| (3) Copper foil adhesiveness (kN/m) | 1.3 | 1.2 | 1.3 | 1.3 | 1.3 | 1.3 |
| (4) Hygroscopicity (water absorption coefficient, %) | 0.5 | 0.5 | 0.5 | 0.5 | 0.5 | 0.5 |
| (5) Chemical resistance (rate of change of mass, % by mass) | | | | | | |
| 18% by mass hydrochloric acid | −0.010 | −0.009 | −0.009 | −0.008 | −0.008 | −0.008 |
| 10% by mass NaOH aqueous solution | −0.020 | −0.025 | −0.025 | −0.020 | −0.020 | −0.020 |

TABLE 6

|  | Example 25 | Example 26 | Example 27 | Example 28 | Example 29 | Example 30 | Example 31 |
|---|---|---|---|---|---|---|---|
| Thermosetting Resin Composition (part by mass) | | | | | | | |
| (A) Resin composition having unsaturated maleimide group | | | | | | | |
| A-14 | 90 | | | | | | |
| A-15 | | | 50 | 50 | 50 | | |

TABLE 6-continued

|  | Example 25 | Example 26 | Example 27 | Example 28 | Example 29 | Example 30 | Example 31 |
|---|---|---|---|---|---|---|---|
| A-16 |  |  |  |  | 50 | 70 |  |
| A-17 |  |  |  |  |  |  | 50 |
| (B) Thermosetting resin |  |  |  |  |  |  |  |
| Biphenyl aralkyl type epoxy resin (NC-3000-H) |  | 49.5 |  |  |  |  | 30 |
| HP-4032D | 5 |  | 35 |  |  | 20 |  |
| HSN-175 |  |  |  | 30 | 30 |  |  |
| HSN-375 |  |  |  |  |  |  |  |
| (C) Modified imidazole |  |  |  |  |  |  |  |
| Isocyanate-masked imidazole (G8009L) | 0.5 | 0.5 | 0.5 | 0.5 | 0.5 | 0.5 | 0.5 |
| (E) Inorganic filler |  |  |  |  |  |  |  |
| Fused silica (SC2050-KC) | 40 | 40 | 40 | 40 | 40 |  | 40 |
| (G) Phosphorus-containing compound |  |  |  |  |  |  |  |
| HCA-HQ | 3 |  |  |  | 5 | 3 | 3 |
| ZX-1548-3 |  |  | 10 |  |  |  |  |
| OP-930 |  | 3 |  | 3 |  |  |  |
| (H) Compound achieving chemical roughening |  |  |  |  |  |  |  |
| XER-91 | 1 |  |  | 1 |  | 1 | 1 |
| KS-23Z |  |  |  |  | 1 | 1 |  |
| (I) Epoxy curing agent |  |  |  |  |  |  |  |
| LA-3018 |  |  |  | 19.5 | 19.5 |  | 19.5 |
| Benzoguanamine | 4.5 |  | 4.5 |  |  |  |  |
| Phosphorus atom content | 0.3 | 0.7 | 0.3 | 0.7 | 0.5 | 0.3 | 0.3 |
| Results of Measurement and Evaluation |  |  |  |  |  |  |  |
| Varnish |  |  |  |  |  |  |  |
| (1) Curing property (time to gelation $T_0$, sec) | 560 | 400 | 390 | 370 | 380 | 400 | 370 |
| (2) Storage stability (after storing at 40° C. for 3 days $T_1$, sec) | 556 | 396 | 386 | 366 | 377 | 398 | 365 |
| Storage stability (%) = $T_1/T_0$ | 99.3 | 99.0 | 99.0 | 98.9 | 99.2 | 99.5 | 98.6 |
| Copper-clad laminate plate |  |  |  |  |  |  |  |
| (1) Heat resistance (glass transition temperature, ° C.) | 290 | 210 | 230 | 220 | 230 | 240 | 220 |
| (2) Thermal expansion coefficient (ppm/° C.) | 24 | 38 | 38 | 39 | 37 | 35 | 40 |
| (3) Copper foil adhesiveness (kN/m) | 1.1 | 1.0 | 1.0 | 1.1 | 1.1 | 1.2 | 1.1 |
| (4) Hygroscopicity (water absorption coefficient, %) | 0.5 | 0.5 | 0.5 | 0.5 | 0.5 | 0.6 | 0.5 |
| (5) Chemical resistance (rate of change of mass, % by mass) |  |  |  |  |  |  |  |
| 18% by mass hydrochloric acid | −0.010 | −0.009 | −0.010 | −0.010 | −0.008 | −0.009 | −0.008 |
| 10% by mass NaOH aqueous solution | −0.030 | −0.025 | −0.020 | −0.025 | −0.020 | −0.025 | −0.015 |

It is apparent from Tables 1, 2 and 4 to 6 that Examples according to the present invention are all excellent in curing property and storage stability of the varnishes. On the other hand, Comparative Examples in Table 3 are considerably poor in at least one of curing property and storage stability since the modified imidazole compound (C) is not contained.

It is apparent from Tables 1, 2 and 4 to 6 that Examples according to the present invention are all excellent in heat resistance (Tg), copper foil adhesiveness, moisture resistance and chemical resistance. On the other hand, Comparative Examples in Table 3 are considerably poor in at least one of these characteristics since the modified imidazole compound (C) is not contained.

Example B

Production Example 1

Production of Solution of Resin Composition Having Unsaturated Maleimide Group (A-1)

569.30 g of bis(4-maleimidophenyl)methane, 59.04 g of 4,4'-diaminodiphenylmethane and 350.00 g of propylene glycol monomethyl ether were placed in a reaction vessel having a capacity of 2 L capable of being heated and cooled, equipped with a thermometer, an agitator and a water quantity meter having a reflux condenser, and were reacted for 5 hours under refluxing, thereby providing a solution of a resin composition having an unsaturated maleimide group (A-1).

Production Example 2

Production of Solution of Resin Composition Having Unsaturated Maleimide Group (A-2)

555.04 g of bis(4-maleimidophenyl)methane, 73.84 g of 3,3'-diethyl-4,4'-diaminodiphenylmethane and 350.00 g of propylene glycol monomethyl ether were placed in a reaction vessel having a capacity of 2 L capable of being heated and cooled, equipped with a thermometer, an agitator and a water quantity meter having a reflux condenser, and were reacted for 5 hours under refluxing, thereby providing a solution of a resin composition having an unsaturated maleimide group (A-2).

Production Example 3

Production of Solution of Resin Composition Having Unsaturated Maleimide Group (A-3)

556.53 g of bis(4-maleimidophenyl)methane, 72.29 g of 3,3'-diaminodiphenyl sulfone and 350.00 g of dimethylacetamide were placed in a reaction vessel having a capacity of 2 L capable of being heated and cooled, equipped with a thermometer, an agitator and a water quantity meter having a reflux condenser, and were reacted at 100° C. for 5 hours, thereby providing a solution of a resin composition having an unsaturated maleimide group (A-3).

Production Example 4

Production of Solution of Resin Composition Having Unsaturated Maleimide Group (A-4)

562.69 g of polyphenylmethanemaleimide, 66.03 g of 3,3'-dimethyl-4,4'-diaminodiphenylmethane and 350.00 g of propylene glycol monomethyl ether were placed in a reaction vessel having a capacity of 2 L capable of being heated and cooled, equipped with a thermometer, an agitator and a water quantity meter having a reflux condenser, and were reacted for 5 hours under refluxing, thereby providing a solution of a resin composition having an unsaturated maleimide group (A-4).

Comparative Production Example 1

Production of Solution of Resin Composition Having Unsaturated Maleimide Group (A-5)

358.00 g of bis(4-maleimidophenyl)methane and 54.50 g of 4,4'-diaminodiphenylmethane were placed in a kneader having a capacity of 1 L, equipped with a steam heating device, kneaded under heat at from 135 to 140° C. for 15 minutes, then cooled and pulverized, thereby providing powder of a resin composition having an unsaturated maleimide group (A-5).

Comparative Production Example 2

Production of Solution of Resin Composition Having Unsaturated Maleimide Group (A-6)

358.00 g of polyphenylmethanemaleimide and 68.50 g of 3,3'-dimethyl-4,4'-diaminodiphenylmethane were placed in a kneader having a capacity of 1 L, equipped with a steam heating device, kneaded under heat at from 135 to 140° C. for 15 minutes, then cooled and pulverized, thereby providing powder of a resin composition having an unsaturated maleimide group (A-6).

Examples 1 to 7 and Comparative Examples 1 to 6

Uniform varnishes having a resin content (i.e., a total amount of the resin components) of 65% by mass were produced by mixing the following ingredients according to the mixing ratios (by mass) shown in Tables 1 to 3:

as the curing agent, the solutions of the resin composition having an unsaturated maleimide group (A) obtained in Production Examples 1 to 5 and Comparative Production Examples 1 and 2, as the thermosetting resin (B), a novolak type cyanate resin (PT-30, a trade name, produced by Lonza Japan, Ltd.), a bisphenol A dicyanate prepolymer (BA230, a trade name, produced by Lonza Japan, Ltd.), a tetrafunctional naphthalene type epoxy resin (EXA-4710, a trade name, produced by Dainippon Ink And Chemicals, Inc.), and a biphenyl aralkyl type epoxy resin (NC-3000-H, a trade name, produced by Nippon Kayaku Co., Ltd.), as the modified imidazole (C), 2,4-diamino-6-[2'-undecylimidazolyl-(1)']-ethyl-S-triazine (C11Z-A, a trade name, produced by Shikoku Chemicals Corporation), and 2,4-diamino-6-[2'-ethyl-4-methylimidazolyl-(1)']-ethyl-S-triazine (2E4MZ-A, a trade name, produced by Shikoku Chemicals Corporation), as the amine compound having an acidic substituent (D), p-aminophenol (produced by Ihara Chemical Industry Co., Ltd.), as the inorganic filler (E), fused silica (SC2050-KC, a trade name, produced by Admatechs Co., Ltd.), aluminum hydroxide (HP-360, a trade name, produced by Showa Denko K. K.), and boehmite (BMT-3LV, a trade name, produced by Kawai Lime Industry Co., Ltd.), and as the diluent solvent, methyl ethyl ketone.

In Comparative Examples, 2-undecylimidazole (C11Z, a trade name, produced by Shikoku Chemicals Corporation) and 2-ethyl-4-methylimidazole (2E4MZ, a trade name, produced by Shikoku Chemicals Corporation), which were each a curing accelerator (i.e., a non-modified imidazole), were used instead of the modified imidazole (C).

The varnishes thus produced were evaluated for the curing property (i.e., the time to gelation) and the storage stability of the varnishes according to the methods described above.

The varnishes were each coated by impregnation on an E-glass cloth having a thickness of 0.1 mm and dried under heat at 160° C. for 10 minutes, thereby providing a prepreg having a resin content of 50% by mass. Four sheets of the prepreg were laminated with electrolytic copper foils having a thickness of 18 μm disposed on both surfaces thereof, and the assembly was pressed at a pressure of 2.5 MPa and a temperature of 185° C. for 90 minutes, thereby producing a copper-clad laminate plate.

The resulting copper-clad laminate plates were measured and evaluated for the heat resistance, the thermal expansion coefficient, the copper foil adhesiveness, the hygroscopicity, the chemical resistance and the maximum warpage. The results are shown in Tables 1 to 3.

TABLE 7

|  | Example 1 | Example 2 | Example 3 | Example 4 | Example 5 | Example 6 |
|---|---|---|---|---|---|---|
| (A) Resin composition having unsaturated maleimide group | | | | | | |
| A-1 | 50 | | | | | 49 |
| A-2 | | 50 | 50 | | | |
| A-3 | | | | 50 | | |
| A-4 | | | | | 49 | |
| (B) Thermosetting resin | | | | | | |
| PT-30 | 49.5 | | | | | 49.5 |
| BA230 | | 49.5 | | | | |
| EXA-4710 | | | 49.5 | | | |
| NC-3000-H | | | | 49.5 | 49.5 | |
| (C) Modified imidazole | | | | | | |
| 2E4MZ-A | 0.5 | 0.5 | | 0.5 | 0.5 | 0.5 |
| C11Z-A | | | 0.5 | | | |
| (D) Amine compound having acidic substituent | | | | | | |
| p-Aminophenol | | | | | 1 | 1 |
| (E) Inorganic filler | | | | | | |
| SC2050-KC | | | | | | 50 |
| HP-360 | | | | | | |
| BMT-3LV | | | | | | |
| (E) Molybdenum compound | | | | | | |
| KEMGARD 1100 | | 10 | | | | |
| Results of Measurement and Evaluation | | | | | | |
| Time to gelation (sec) | 410 | 440 | 490 | 450 | 390 | 450 |
| Time to gelation after storing at 40° C. for 3 days (sec) | 405 | 436 | 488 | 446 | 388 | 445 |
| (1) Heat resistance (Tg) | 220 | 210 | 220 | 220 | 220 | 210 |
| (2) Thermal expansion coefficient (ppm/° C.) | 50 | 50 | 50 | 47 | 50 | 28 |
| (3) Copper foil adhesiveness (kN/m) | 1.4 | 1.3 | 1.4 | 1.4 | 1.4 | 1.2 |
| (4) Hygroscopicity (water absorption coefficient, %) | 0.6 | 0.6 | 0.6 | 0.6 | 0.6 | 0.5 |
| (5) Chemical resistance (rate of change of mass, % by weight) | | | | | | |
| 18% by weight hydrochloric acid | −0.006 | −0.006 | −0.006 | −0.006 | −0.006 | −0.007 |
| 10% by weight NaOH aqueous solution | −0.008 | −0.008 | −0.008 | −0.008 | −0.008 | −0.009 |
| (6) Maximum warpage (mm) | 2 | 2 | 2 | 2 | 2 | 1 |

TABLE 8

|  | Example 7 | Example 8 | Example 9 | Example 10 | Example 11 | Example 12 |
|---|---|---|---|---|---|---|
| (A) Resin composition having unsaturated maleimide group | | | | | | |
| A-2 | 49 | | | 48 | | |
| A-3 | | 49 | 49 | | | |
| A-4 | | | | | 49 | |
| A-5 | | | | | | 49 |
| (B) Thermosetting resin | | | | | | |
| PT-30 | | | | | | |
| BA230 | | 20 | | | | |
| EXA-4710 | 49.5 | 29.5 | 20 | | 49 | |
| NC-3000-H | | | 29.5 | 49.5 | | 49 |
| (C) Modified imidazole | | | | | | |
| 2E4MZ-A | 0.5 | 0.5 | | 0.5 | 0.5 | 0.5 |
| C11Z-A | | | 0.5 | | 0.5 | 0.5 |

TABLE 8-continued

|  | Example 7 | Example 8 | Example 9 | Example 10 | Example 11 | Example 12 |
|---|---|---|---|---|---|---|
| (D) Amine compound having acidic substituent |  |  |  |  |  |  |
| p-Aminophenol | 1 | 1 | 1 | 2 | 1 | 1 |
| (E) Inorganic filler |  |  |  |  |  |  |
| SC2050-KC | 50 | 50 | 50 | 50 | 50 | 60 |
| HP-360 | 50 | 50 |  |  |  |  |
| BMT-3LV |  |  | 50 | 50 | 50 | 50 |
| (E) Molybdenum compound |  |  |  |  |  |  |
| KEMGARD 1100 |  | 10 | 10 | 10 | 10 | 10 |
| Results of Measurement and Evaluation |  |  |  |  |  |  |
| Time to gelation (sec) | 440 | 440 | 430 | 430 | 380 | 380 |
| Time to gelation after storing at 40° C. for 3 days (sec) | 437 | 437 | 426 | 425 | 374 | 375 |
| (1) Heat resistance (Tg) | 210 | 230 | 230 | 220 | 220 | 210 |
| (2) Thermal expansion coefficient (ppm/° C.) | 24 | 23 | 21 | 46 | 49 | 27 |
| (3) Copper foil adhesiveness (kN/m) | 1.3 | 1.4 | 1.4 | 1.4 | 1.4 | 1.4 |
| (4) Hygroscopicity (water absorption coefficient, %) | 0.5 | 0.5 | 0.5 | 0.6 | 0.6 | 0.5 |
| (5) Chemical resistance (rate of change of mass, % by weight) |  |  |  |  |  |  |
| 18% by weight hydrochloric acid | −0.007 | −0.007 | −0.006 | −0.006 | −0.006 | −0.007 |
| 10% by weight NaOH aqueous solution | −0.008 | −0.008 | −0.008 | −0.008 | −0.008 | −0.009 |
| (6) Maximum warpage (mm) | 1 | 1 | 0.5 | 2 | 2 | 0.5 |

TABLE 9

|  | Comp. Example 1 | Comp. Example 2 | Comp. Example 3 | Comp. Example 4 | Comp. Example 5 | Comp. Example 6 |
|---|---|---|---|---|---|---|
| (A) Resin composition having unsaturated maleimide group |  |  |  |  |  |  |
| A-1 | 50 | 50 |  |  |  |  |
| A-2 |  |  | 49 | 49 |  |  |
| A-6 |  |  |  |  | 50 |  |
| A-7 |  |  |  |  |  | 49 |
| (B) Thermosetting resin |  |  |  |  |  |  |
| PT-30 | 50 |  |  |  |  |  |
| BA230 |  |  | 49.5 |  |  |  |
| EXA-4710 |  | 49.5 |  |  | 49.5 |  |
| NC-3000-H |  |  |  | 49.5 |  | 49 |
| (D) Amine compound having acidic substituent |  |  |  |  |  |  |
| p-Aminophenol |  |  | 1 | 1 |  | 1 |
| (E) Inorganic filler |  |  |  |  |  |  |
| SC2050-KC |  |  | 50 | 50 | 50 | 50 |
| HP-360 |  |  |  |  | 50 |  |
| BMT-3LV |  |  |  | 50 |  | 50 |
| (E) Molybdenum compound |  |  |  |  |  |  |
| KEMGARD 1100 |  | 10 | 10 | 10 | 10 | 10 |
| Curing accelerator (non-modified imidazole) |  |  |  |  |  |  |
| 2E4MZ |  | 0.5 |  |  |  | 0.5 |
| C11Z |  |  |  | 0.5 | 0.5 | 0.5 |

TABLE 9-continued

|  | Comp. Example 1 | Comp. Example 2 | Comp. Example 3 | Comp. Example 4 | Comp. Example 5 | Comp. Example 6 |
|---|---|---|---|---|---|---|
| Results of Measurement and Evaluation |  |  |  |  |  |  |
| Time to gelation (sec) | 600 | 400 | 550 | 400 | 350 | 350 |
| Time to gelation after storing at 40° C. for 3 days (sec) | 550 | 250 | 500 | 220 | 200 | 180 |
| (1) Heat resistance (Tg) | 180 | 180 | 170 | 180 | 140 | 150 |
| (2) Thermal expansion coefficient (ppm/° C.) | 66 | 59 | 40 | 35 | 40 | 40 |
| (3) Copper foil adhesiveness (kN/m) | 1.0 | 1.2 | 1.2 | 1.1 | 0.8 | 1.0 |
| (4) Hygroscopicity (water absorption coefficient, %) | 0.7 | 0.6 | 0.5 | 0.5 | 0.8 | 0.7 |
| (5) Chemical resistance (rate of change of mass, % by weight) |  |  |  |  |  |  |
| 18% by weight hydrochloric acid | −0.015 | −0.007 | −0.015 | −0.007 | −0.020 | −0.015 |
| 10% by weight NaOH aqueous solution | −0.020 | −0.008 | −0.040 | −0.009 | −0.040 | −0.032 |
| (6) Maximum warpage (mm) | 6 | 4 | 5 | 4 | 8 | 8 |

It is apparent from Tables 7 and 8 that Examples according to the present invention are all excellent in curing property and storage stability of the varnishes. On the other hand, Comparative Examples in Table 9 are considerably poor in at least one of curing property and storage stability since the modified imidazole compound (C) is not contained.

It is apparent from Tables 7 and 8 that Examples according to the present invention are all excellent in heat resistance (Tg), copper foil adhesiveness, moisture resistance, chemical resistance and low warpage property. On the other hand, Comparative Examples in Table 9 are considerably poor in at least one of these characteristics since the modified imidazole compound (C) is not contained.

The invention claimed is:

1. A thermosetting resin composition comprising:
(A) a resin composition having an unsaturated maleimide group, which is a reaction product produced by reacting (a) a maleimide compound having at least two N-substituted maleimide groups per one molecule and (b) an amine compound having at least two primary amino groups per one molecule, wherein in producing said reaction product, the maleimide compound (a) and the amine compound (b) are used in a ration that satisfies the equivalent ration ($T_a/T_b$) in a range of $1.0<T_a/T_b \leq 10.0$, where ($T_a/T_b$) is the equivalent ratio of the equivalent ($T_a$) of the maleimide group in the maleimide compound (a) to the equivalent ($T_b$) of the —NH$_2$ group in the amine compound (b);
(B) a thermosetting resin;
(C) a modified imidazole compound represented by any one of the following general formulae (I) and (II):

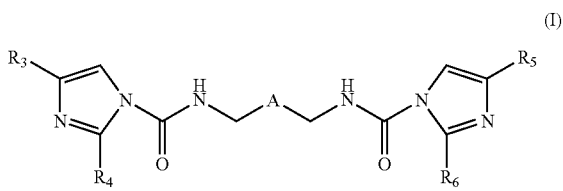

(I)

wherein $R_3$, $R_4$, $R_5$ and $R_6$ each independently represent a hydrogen atom, an aliphatic hydrocarbon group having from 1 to 20 carbon atoms or a phenyl group;
and A represents an alkylene group or an aromatic hydrocarbon group,

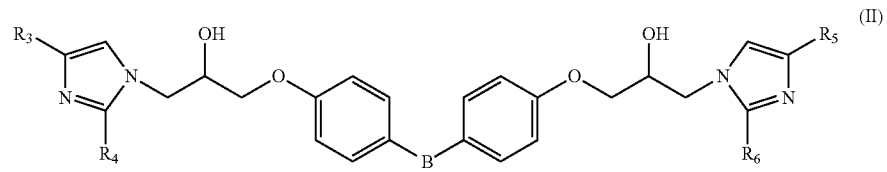

(II)

wherein $R_3$, $R_4$, $R_5$ and $R_6$ each independently represent a hydrogen atom, an aliphatic hydrocarbon group having from 1 to 20 carbon atoms or a phenyl group;
and B represents a single bond, an alkylene group, an alkylidene group, an ether group or a sulfonyl group; and (D) an amine compound having an acidic substituent represented by the following general formula (IV):

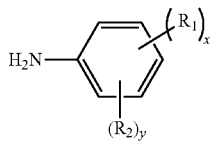

wherein $R_1$ each independently represent a hydroxyl group, a carboxyl group or a sulfonic acid group as the acidic substituent; $R_2$ each independently represent a hydrogen atom, an aliphatic hydrocarbon group having from 1 to 5 carbon atoms or a halogen atom; x represents an integer of from 1 to 5; and y represents an integer of from 0 to 4, provided that a sum of x and y is 5.

2. The thermosetting resin composition according to claim 1, wherein the thermosetting resin composition further comprises (E) an inorganic filler.

3. The thermosetting resin composition according to claim 1, wherein the thermosetting resin composition further comprises (F) a molybdenum compound.

4. The thermosetting resin composition according to claim 1, wherein the thermosetting resin composition further comprises (G) a phosphorus-containing compound that imparts flame retardancy.

5. The thermosetting resin composition according to claim 1, wherein the thermosetting resin composition further comprises (H) a compound that achieves chemical roughening.

6. The thermosetting resin composition according to claim 1, wherein the thermosetting resin (B) is at least one selected from the group consisting of an epoxy resin, a phenol resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin and a melamine resin.

7. The thermosetting resin composition according to claim 2, wherein the inorganic filler (E) is fused spherical silica and/or a metal hydrate that has a thermal decomposition temperature of 300° C. or more.

8. An insulating film with a support comprising a support having formed on a surface thereof a film containing the thermosetting resin composition according to claim 1 in a semi-cured state.

9. A prepreg comprising the thermosetting resin composition according to claim 1 that is coated on a reinforcing substrate in a form of a fiber sheet, and is rendered into a B-stage.

10. A laminate plate comprising at least one sheet of the insulating film with a support according to claim 8.

11. A printed wiring board comprising the laminate plate according to claim 10.

12. A laminate plate comprising at least one sheet of the prepreg according to claim 9.

13. A printed wiring board comprising the laminate plate according to claim 12.

14. A laminate plate comprising (i) at least one sheet of an insulating film with a support comprising a support having formed on a surface thereof a film containing the thermosetting resin composition according to claim 1 in a semi-cured state, and (ii) at least one sheet of a prepreg comprising said thermosetting resin composition that is coated on a reinforcing substrate in a form of a fiber sheet and is rendered into a B-stage.

15. A printed wiring board comprising the laminate plate according to claim 14.

16. The thermosetting resin composition according to claim 1, wherein said modified imidazole compound (C) is the compound represented by the general formula (I).

17. The thermosetting resin composition according to claim 1, which contains 0.01 to 10 parts by mass of the modified imidazole compound (C) per 100 parts by mass of the thermosetting resin (B).

18. The thermosetting resin composition according to claim 1, wherein said modified imidazole compound (C) is the compound represented by the general formula (II).

19. A resin varnish comprising the thermosetting resin composition according to claim 1 and an organic solvent therefore.

20. The thermosetting resin composition according to claim 1, wherein said reaction product has been produced by reacting said maleimide compound and said amine compound in an organic solvent.

21. The thermosetting resin composition according to claim 1, wherein the amine compound (D) is at least one selected from the group consisting of m-aminophenol, p-aminophenol, o-aminophenol, p-aminobenzoic acid, m-aminobenzoic acid, o-aminobenzoic acid, o-aminobenzenesulfonic acid, m-aminobenzenesulfonic acid, p-aminobenzenesulfonic acid, 3,5-dihydroxyaniline and 3,5-dicarboxyaniline.

22. The thermosetting resin composition according to claim 1, wherein the resin composition having an unsaturated maleimide group (A) and the amine compound (D) are used in a ratio that satisfies the equivalent ratio $(T_A/T_D)$ in a range of $1.0 < (T_A/T_D) \leq 10.0$, where $(T_A/T_D)$ is the equivalent ratio of the equivalent $(T_A)$ of the maleimide group of the resin composition (A) to the equivalent $(T_D)$ of the $-NH_2$ group in the amine compound (D).

* * * * *